United States Patent
Huang et al.

(10) Patent No.: US 12,207,552 B2
(45) Date of Patent: Jan. 21, 2025

(54) THERMAL RADIATION SENSOR COMPRISING AN IONIC CONDUCTOR

(71) Applicant: The Hong Kong University of Science and Technology, Kowloon (HK)

(72) Inventors: Baoling Huang, Hong Kong (HK); Cheng Chi, Hong Kong (HK); Gongze Liu, Hong Kong (HK)

(73) Assignee: THE HONG KONG UNIVERSITY OF SCIENCE AND TECHNOLOGY, Kowloon (HK)

( * ) Notice: Subject to any disclaimer, the term of this patent is extended or adjusted under 35 U.S.C. 154(b) by 0 days.

(21) Appl. No.: 17/675,219

(22) Filed: Feb. 18, 2022

(65) Prior Publication Data

US 2022/0278264 A1 Sep. 1, 2022

Related U.S. Application Data

(60) Provisional application No. 63/153,959, filed on Feb. 26, 2021.

(51) Int. Cl.
*H10N 10/17* (2023.01)
*H10N 10/01* (2023.01)

(52) U.S. Cl.
CPC ............. *H10N 10/17* (2023.02); *H10N 10/01* (2023.02)

(58) Field of Classification Search
CPC ............................... H10N 10/01; H10N 10/17
See application file for complete search history.

(56) References Cited

U.S. PATENT DOCUMENTS

| 4,558,342 A | 12/1985 | Sclar |
| 6,300,554 B1 | 10/2001 | Du et al. |
| 6,597,051 B2 | 7/2003 | Lubomirsky et al. |
| (Continued) | | |

FOREIGN PATENT DOCUMENTS

| CN | 110165043 B | 7/2020 | |
| WO | 2008088393 A2 | 7/2008 | |
| WO | WO-2016021893 A1 * | 2/2016 | ............. H01L 35/02 |

OTHER PUBLICATIONS

Machine translation of WO 2016021893 A1 (Year: 2016).*
(Continued)

*Primary Examiner* — Tamir Ayad
(74) *Attorney, Agent, or Firm* — Amin, Turocy & Watson, LLP

(57) ABSTRACT

One or more devices, systems, apparatuses, methods of manufacture and/or methods of use to facilitate thermal sensing in a field related to thermal radiation are envisioned. In one embodiment, an ionic thermoelectric thermal radiation sensor, comprises a substrate, an ionic thermoelectric sensing unit arranged on the substrate and comprising ionically conductive and electrically insulating material, wherein the ionic thermoelectric sensing unit is a voltage-producing unit having first and second surfaces spaced apart from and disposed opposite to one other, wherein the ionic thermoelectric sensing unit produces voltage via thermal diffusion of ions or via the Soret effect under a temperature difference between the first and second surfaces, a thermal radiation absorber that generates heat when exposed to thermal radiation, and one or more electrical connectors that connect the first and second surface.

20 Claims, 17 Drawing Sheets

(56) References Cited

U.S. PATENT DOCUMENTS

| | | |
|---|---|---|
| 7,755,048 B2 | 7/2010 | Hsu |
| 8,969,705 B2 | 3/2015 | Laudo |
| 9,461,228 B2 | 10/2016 | Kato et al. |
| 9,978,926 B2 | 5/2018 | Huang et al. |
| 2013/0276851 A1 | 10/2013 | Crispin et al. |
| 2014/0326883 A1 | 11/2014 | Abdolvand et al. |
| 2016/0336502 A1* | 11/2016 | Huang .................. G01J 5/024 |

OTHER PUBLICATIONS

Zhao, et al., "Polymer gels with tunable ionic Seebeck coefficient for ultra-sensitive printed thermopiles," Nat. Commun., vol. 10, No. 1, pp. 1-8, Mar. 6, 2019, doi: 10.1038/s41467-019-08930-7.

Randjelovic, et al., "Intelligent thermal vacuum sensors based on multipurpose thermopile MEMS chips," Vacuum, vol. 101, pp. 118-124, Nov. 17, 2012, http://dx.doi.org/10.1016/j.vacuum.2013.07.044.

Chen, et al., "Fabrication of three-dimensional split ring resonators by stress-driven assembly method," Opt. Express, vol. 20, No. 9, pp. 9415-9420, Apr. 23, 2012.

Han, et al., "Thermoelectric Polymer Aerogels for Pressure-Temperature Sensing Applications," Adv. Funct. Mater. Oct. 4, 2017, 1703549, DOI: 10.1002/adfm.201703549.

* cited by examiner

THERMAL RADIATION SENSOR COMPRISING AN IONIC CONDUCTOR

RELATED APPLICATION

The subject international patent application claims the benefit of priority from U.S. Provisional Patent Application No. 63/153,959, filed Feb. 26, 2021, and entitled "THERMAL RADIATION SENSOR BASED ON IONIC CONDUCTORS," the entirety of which application is hereby incorporated by reference herein.

BACKGROUND

One or more embodiments described herein relate to a thermal radiation sensor, and more specifically to a thermal radiation sensor comprising an ionic conductor, which thermal radiation sensor can be employed in fields relating to thermal radiation.

SUMMARY

The following presents a summary to provide a basic understanding of one or more embodiments described herein. This summary is not intended to identify key or critical elements, or to delineate any scope of the particular embodiments and/or any scope of the claims. The sole purpose of the summary is to present concepts in a simplified form as a prelude to the more detailed description that is presented later. In one or more embodiments described herein, devices, systems, methods and/or apparatuses are described that can facilitate thermal sensing in a field related to thermal radiation.

According to an embodiment, ionic thermoelectric thermal radiation sensor, comprises a substrate, an ionic thermoelectric sensing unit arranged on the substrate and comprising ionically conductive and electrically insulating material, wherein the ionic thermoelectric sensing unit is a voltage-producing unit having first and second surfaces spaced apart from and disposed opposite to one other, wherein the ionic thermoelectric sensing unit produces voltage via thermal diffusion of ions or via the Soret effect under a temperature difference between the first and second surfaces, a thermal radiation absorber that generates heat when exposed to thermal radiation, and one or more electrical connectors that connect the first and second surface.

According to another embodiment, a method for fabricating an ionic thermoelectric thermal radiation sensor can comprise applying an ionic thermoelectric sensing layer on a substrate, the layer comprising ionically conductive and electrically insulating material and being a voltage-producing layer having first and second surfaces spaced apart from and disposed opposite to one other, wherein the ionic thermoelectric sensing unit produces voltage via thermal diffusion of ions or via the Soret effect under a temperature difference between the first and second surfaces, applying another layer comprising a thermal radiation absorber that generates heat when exposed to thermal radiation; and connecting to the first surface, second surface, or both first and second surfaces of the ionic thermoelectric sensing layer one or more electrical connectors.

According to still another embodiment, an ionic thermoelectric thermal radiation sensor array can comprise a substrate, ionic thermoelectric sensing units arranged on the substrate and comprising ionically conductive and electrically insulating material, wherein the ionic thermoelectric sensing units are voltage-producing units each having first and second surfaces spaced apart from and disposed opposite to one other, a thermal radiation absorber that generates heat when exposed to thermal radiation, and one or more electrical connectors that connect the first and second surfaces in series, in parallel or both, wherein pairs of a spaced apart positive-type ionic thermoelectric sensing unit and negative-type ionic the ionic thermoelectric sensing unit of the ionic thermoelectric sensing units comprise respective passivity sensors that generate respective voltages due to respective thermal diffusions of ions or due to the Soret effect under respective temperature differences between the first and second surfaces of the respective pairs.

According to yet another embodiment, an ionic thermoelectric thermal radiation sensor array can comprise a substrate, electrical conductors, and ionic thermoelectric pillars arranged in a patterned array. The ionic thermoelectric pillars can comprise negative type ionic thermoelectric pillars and positive type ionic thermoelectric pillars. The negative type ionic thermoelectric pillars and the positive type ionic thermoelectric pillars can be connected to one another along the substrate. Respective thermal radiation absorbers can be arranged on pairs of the ionic thermoelectric pillars. The pairs of the ionic thermoelectric pillars can comprise a respective negative type ionic thermoelectric pillar of the negative type ionic thermoelectric pillars and a respective positive type ionic thermoelectric pillar of the positive type thermoelectric pillar. The negative type ionic thermoelectric pillars and the positive type ionic thermoelectric pillars can be connected to one another in series by the electrical conductors. The pairs of the ionic thermoelectric pillars can comprise respective passivity sensors that can generate respective voltages due to respective thermal diffusions of ions under respective temperature differences.

According to an embodiment, an ionic thermoelectric thermal radiation sensor can comprise a vertical stacking structure comprising a substrate, an insulating layer, an ionic thermoelectric thermal radiation sensor, a radiation absorber, a support layer and one or more electrical connectors. The vertical stacking structure can be comprised by a passivity sensor that generates a respective voltage due to thermal diffusions of ions or due to the Soret effect under temperature difference between surfaces of a pair of the ionic thermoelectric thermal radiation sensors.

According to another embodiment, a thermoelectric sensor can comprise a polymer-based structure capable of being fabricated by an efficient and cost-effective fabrication process. A heat generation layer and sensing layer can be fabricated by spin coating or spray coating. A laser cutting method can be applied to isolate pillars from one another. Three-dimensional (3D) printing and/or electrospinning can additionally or alternatively be applied to fabricate pixel structures (e.g., sensor structures where each sensor of a sensor array can serve as a pixel of an imaging device comprising the sensor array) with a high resolution of several micrometers for such polymer-based, thermoelectric sensors. The low cost fabrication process can be suitable for fabrication of disposable devices.

According to still another embodiment, an ionic-conductor-based thermal radiation sensor with high responsivity can be provided. The heat generation layers can comprise silicon dioxide, silicon nitride and/or other materials that have high absorption for infrared. The ionic thermoelectric pillars can be fabricated to comprise ionic polymer gels, solid-state polymer-based electrolytes and/or or polymer composite ionic conductors, which can have a high Seebeck coefficient (>1 mV/K) and low thermal conductivity (<1 W/m-K). As an example, where the Seebeck coefficient reaches 20 mV/K and the thermal conductivity reaches 0.14 W/m-K, the overall performance of one pixel can reach 0.3 mV under the radiation of a black body at 373 K, and the corresponding responsivity can reach more than 1000 V/W for a 20×20 μm pixel according to our calculation.

DESCRIPTION OF THE DRAWINGS

Numerous embodiments, objects, and advantages of the present embodiments will be apparent upon consideration of the following detailed description, taken in conjunction with the accompanying drawings, in which like reference characters refer to like parts throughout.

DETAILED DESCRIPTION

Figure 1:
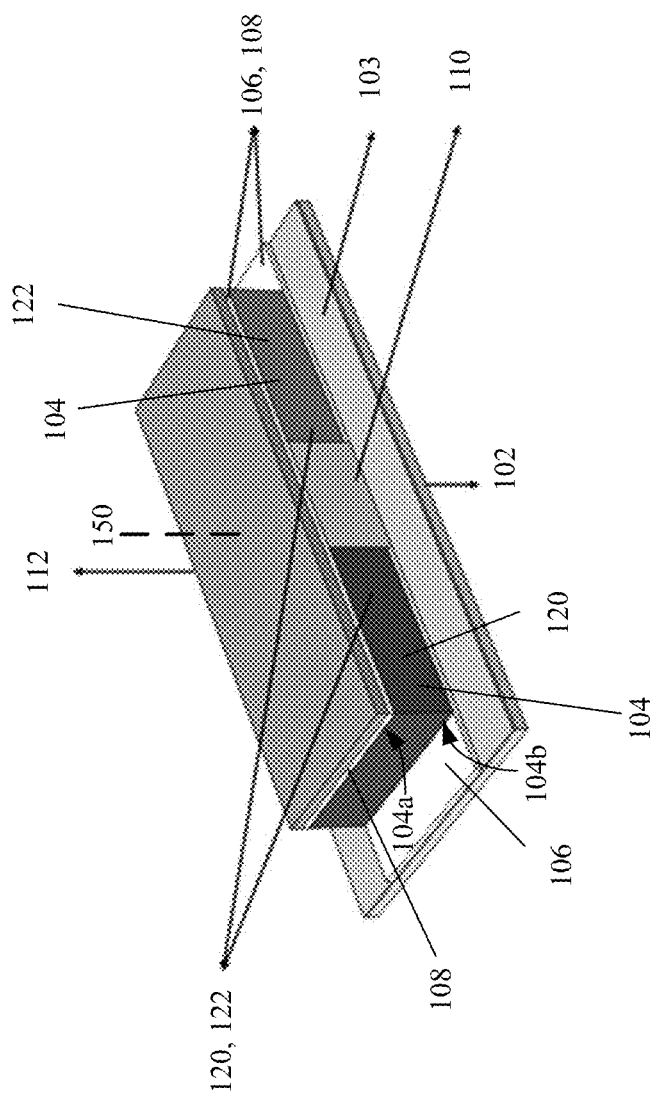
FIG. 1 illustrates a side orthogonal view of an exemplary thermoelectric sensor, in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in this Detailed Description section.

Overview

Thermal radiation sensors, which detect the thermal radiation emission from objects, such as at wavelengths between about 0.7 μm and about 14 μm, can have a wide variety of applications in varying fields, such as night vision, thermal imaging and/or biosensor for disease detection. Various thermal radiation detection technologies include photovoltaic detectors, bolometers, pyroelectric detectors and/or thermoelectric detectors.

Among these technologies, thermoelectric sensors based on the thermoelectric effect can benefit from high stability, low cost for mass production, low power dissipation and/or wide working range. The thermoelectric effect is a conversion, such as a direct conversion, of a temperature different to electrical voltage and vice versa. Likewise, when a voltage is applied to a thermoelectric sensor, heat can be transferred from one side to another of a thermoelectric material or portion of the sensor, creating a temperature difference. This can be caused by an applied temperature gradient causing charge carriers in a material to diffuse from a hot side to a cold side.

Thermoelectric sensors can realize passive sensing without consuming power by using thermoelectric pillars to generate electrical signals whenever there is a delta temperature variation (e.g., temperature difference) caused by thermal radiation. Conventional thermopiles can provide stable and accurate performance on infrared detection when designed based on the Seebeck effect in electrical conductors or semiconductors, which can allow for such devices to offer a Seebeck coefficient below 500 μV/K. The Seebeck effect describes an electromotive force that can be generated across two locations at a material, such as an electrically conducting material, particularly when a temperature difference is exhibited between the two locations. A ratio between the electromotive force and that temperature difference is the Seebeck coefficient (also referred to as thermopower).

Existing thermoelectric sensor technologies based on semiconductor materials can have limited performance and/or can lead to low responsivities around 200 V/W, while commercial bolometers and photovoltaic sensors differently can have high responsivities around 1000 V/W. Therefore, larger sensor sizes can be applied in existing cases to increase signal output.

Further, with existing technologies for thermoelectric sensors, wearable electronic devices can have reduced longevity and/or be prone to damage due to unreliable and generally non-flexible thermoelectric structures used. This can be due to the use of brittle inorganic thermoelectric materials such as semiconductor materials.

In view of the above, smaller sensor sizes with increased signal output can be desirable. Likewise, stronger or more flexible materials with enhanced responsivity, while also having such properties at small sizes, also can be desired.

Thus, to address one or more of the aforementioned deficiencies of existing techniques, one or more embodiments are described herein that can provide one or more devices, systems, methods and/or apparatuses. The one or more embodiments described can employ a polymeric thermoelectric material, which can be constructed in one or more pillars of varying layered materials. The pillars can be spaced from one another and connection between the pillars can allow for the thermoelectric effect therebetween.

Generally, in one embodiment described herein, a passive thermal radiation sensor (also herein referred to as a thermoelectric sensor) based on the ionic thermoelectric effect in ionic conductors can be provided. The thermal radiation sensor can be composed of one or more thermal radiation absorbers, ionic thermoelectric pillars, connection circuits, and substrates.

One or more heat generation layers can comprise silicon dioxide, silicon nitride and/or other materials that have high absorption for infrared. One or more ionic thermoelectric pillars can be fabricated to comprise ionic polymer gels, solid-state polymer-based electrolytes and/or polymer composite ionic conductors, which can have a high Seebeck coefficient (>1 mV/K) and low thermal conductivity (<1 W/m-K). As an example, where the Seebeck coefficient reaches 20 mV/K and the thermal conductivity reaches 0.14 W/m-K, the overall performance of one pixel can reach 0.3 mV under the radiation of a black body at 373 K, and the corresponding responsivity can reach more than 1000 V/W for a 20×20 μm pixel according to our calculation.

The thermal radiation sensor can operate without power consumption. That is, an electric voltage can be generated by the provision of a temperature difference between materials and/or locations of the passive thermal radiation sensor, in view of the thermoelectric effect. Indeed, thermodiffusion of ions instead of electrons or holes can be employed to produce a voltage signal when a temperature gradient is generated under thermal radiation.

An ionic conductor of the thermal radiation sensor can provide an effective ionic Seebeck coefficient, which coefficient can be higher than those of existing thermoelectric materials and/or thermoelectric sensors. Therefore, the responsivity of the thermal radiation sensor can be greatly improved. The ionic conductor can be polymer-based, which can greatly reduce the manufacturing cost as compared to existing thermoelectric materials.

The one or more embodiments of a thermal radiation sensor and/or thermoelectric sensor array as will be described herein can provide one or more of the characteristics of high responsivity, good flexibility, small feature size and/or low cost, which can have broad application in one or more fields related to thermal radiation, such as thermal imaging, night vision, non-destructive flaw analysis, biological monitoring and/or wearable devices.

Further, such thermal radiation sensor can be fabricated by a simple and cost-effective fabrication process. The one or more heat generation layers and/or sensing layers can be fabricated by spin coating and/or spray coating. Three-dimensional printing, electrospinning can also be applied to fabricate structures with a high resolution of several micrometers. A laser cutting method can be applied to isolate pillars from one another. Such polymer-based sensors can be fabricated by a variety of facile methods having low cost, counter to existing photolithography fabrication.

Example Embodiments

One or more embodiments are now described with reference to the drawings, where like referenced numerals are used to refer to like elements throughout. As used herein, both above and below, the term "entity" can refer to a machine, device, smart device, component, hardware, software and/or human. In the following description, for purposes of explanation, numerous specific details are set forth in order to provide a more thorough understanding of the one or more embodiments. It is evident, however, in various cases, that the one or more embodiments can be practiced without these specific details.

Further, it will be appreciated that the embodiments depicted in one or more figures described herein are for illustration only, and as such, the architecture of embodiments is not limited to the systems, devices and/or components depicted therein, nor to any particular order, connection and/or coupling of systems, devices and/or components depicted therein. In one or more described embodiments, computer and/or computing-based elements can be used in connection with implementing one or more of the systems, devices, apparatuses and/or computer-implemented operations shown and/or described in connection with one or more figures described herein.

Generally, a thermoelectric sensor (also herein referred to as a thermal radiation sensor) can comprise a substrate and pillars arranged on the substrate and spaced from one another along the substrate. The pillars can comprise an ionic thermoelectric layer over the substrate, and the ionic thermoelectric layer can comprise a polymeric ion-conducting material. The pillars also can comprise layers of the ion-conducting material and ceramic, carbon and/or metal. A connection circuit can connect the pillars to one another along the substrate.

Turning first to FIG. 1, an exemplary diagram of a thermoelectric sensor 100 is illustrated in accordance with one or more embodiments described herein. The thermoelectric sensor 100 can comprise a substrate 102, one or more thermoelectric materials defining one or more ionic thermoelectric sensing layers 104, circuit connection portions 106 and 108, a support 110 and a radiation absorber 112.

As generally shown, the thermoelectric materials can define an ionic thermoelectric sensing layer 104. Generally, the ionic thermoelectric sensing layer 104 can comprise at least one ionically conductive material absent of electrically conductive materials. The ionic thermoelectric sensing layer 104 can be a voltage-producing layer that can be configured to produce voltage via thermal diffusion of ions or via Soret effect under temperature gradient.

This ionic thermoelectric sensing layer 104 can be constructed as one or more pillars (also herein referred to as ionic sensing units) arranged on the substrate 102, such as pillars 120 and 122 arranged on the substrate 102. The pillars 120, 122 (e.g., ionic sensing units), and thus the thermoelectric materials/ionic thermoelectric sensing layer 104 can comprise negative type and positive type ionic thermoelectric materials and also can comprise ceramic, carbon and/or metal. The ion-conducting materials can comprise negative and positive type ion-conducting polymer gel and/or ion-conducting polymer composite, among other suitable polymer and/or polymeric materials.

The pillars 120 and 122 can have respective width dimensions (w), such as along the substrate 102, in a range from about 0.1 μm to about 100 μm. In one or more embodiments, the pillars 120 and 122 can have different width dimensions. The substrate 102 can comprise silicone, polyimide and/or polyethylene, among other materials.

An insulating material, such as an insulating layer 103, can be disposed between the substrate 102 and the pillars 120, 122, and more particularly between the substrate 102 and a first circuit connection portions 106. The insulating layer can comprise low-stress nitride (LSN).

The first circuit connection portion 106 and the second circuit connection portion 108 can be disposed at opposite sides of the pillars 120, 122. The first circuit connection portion 106 can have two sections, which sections can be separated from one another. One such section can be disposed between the substrate 102 and the first pillar 120, and another such section can be disposed between the substrate 102 and the second pillar 122. In one or more embodiments, the second circuit connection portion 108 can allow for electrical connection between the pillars 120 and 122, and the two sections of the first circuit connection portion 106 can allow for electrical connection to one or more adjacent components of a system, such as one or more additional thermoelectric sensors of a sensor array.

Put another way, the pillars 120, 122 (ionic sensing units 120, 122) can each have a first surface 104a and a second surface 104b. The first surfaces 104a can be spaced apart from the second surfaces 104b along a central longitudinal axis 150. The first surfaces 104a can be disposed opposite the second surfaces 104b and opposite the substrate 102. The electrical connectors 106, 108 can connect the first surfaces 104a, can connect the second surfaces 104b, or can connect the first surfaces 104a and can connect the second surfaces 104b.

In one or more embodiments, additional pillars, such as pairs of pillars, such as one negative type pillar and one positive type pillar, can be further comprised by the thermoelectric sensor 100.

As illustrated, a support 110 can be included for structurally supporting any one or more of the components of the thermoelectric sensor 100, such as the second circuit connection portion 108, the first pillar 120, the second pillar 122 and/or the radiation absorber 112. The support 110 can abut and/or be in direct contact with any one of the first pillar 120, second pillar 122, insulation layer 103 and/or second circuit connection portion 108. The support 110 can be considered a pillar, such as a support pillar.

In one or more embodiments, the support can be comprised of a non-conductive material. In one or more embodiments, the support can be comprised of the same material of an associated ionic sensing unit.

The radiation absorber 112 can be employed to generate heat from infrared, and thus to enable such heat to be converted to an electrical voltage by the thermoelectric material(s). The radiation absorber can be comprised of any suitable material(s) having high absorption and/or selectively for infrared, in one or more embodiments.

That is, as indicated above, where their radiation absorber 112 generates a temperature gradient, such as in response to infrared radiation, the pillars 120 and 122 can act as ionic capacitors and can generate a voltage difference under the temperature gradient.

Turning now to FIGS. 2, 3A, 3B and 4, additional description will be provided regarding the composition of a thermoelectric sensor 200, in accordance with one or more embodiments herein. Particularly, layers of the pillars will be further described, and one or more manufacturing processes will be identified for being employed in fabricating thermoelectric sensor 200. Repetitive description of like elements and/or processes employed in respective embodiments is omitted for sake of brevity.

The thermoelectric sensor 200, and/or the fabrication of the thermoelectric sensor 200, are illustrated schematically using blocks. In one or more other embodiments, the layers can have any suitable thicknesses relative to one another, and thus the respective thicknesses and/or other dimensions of the layers relative to one another as illustrated herein are not meant to be limiting.

Figure 2:
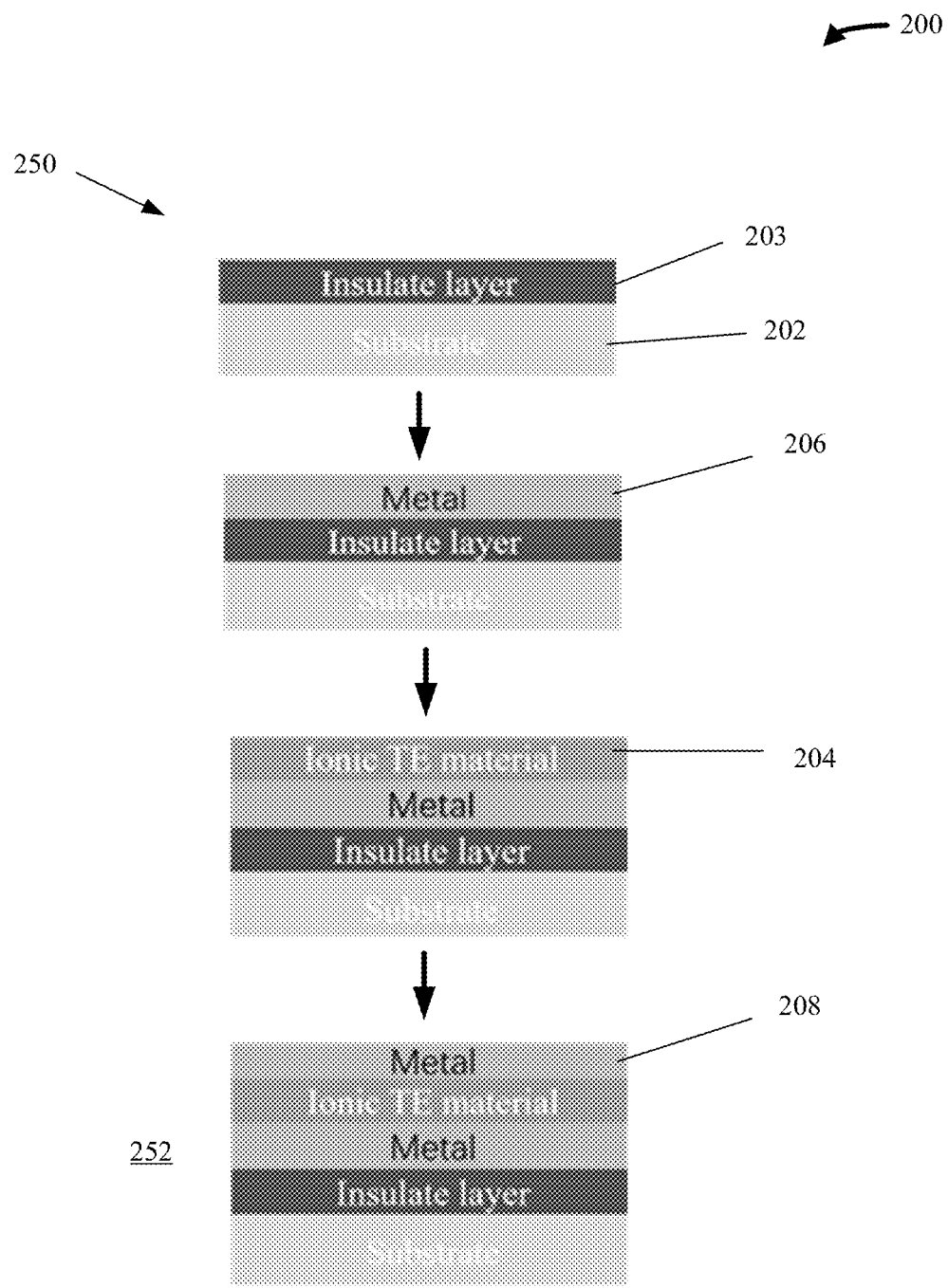
FIG. 2 illustrates a schematic process flow of fabrication of an exemplary thermoelectric sensor, in accordance with one or more embodiments described herein.

Looking first to FIG. 2, a process 250 illustrates that an insulating layer 203 can be applied to a substrate layer 202. A first circuit connection portion 206, such as a lower electrode, can be applied to the insulating layer 203, such as by depositing a metal layer with a sputterer and/or an evaporator.

An ionic thermoelectric layer can be applied to the metal of the first circuit connection portion 206, such as by spin coating to provide a uniformly spin-coated layer. Thereafter, the partially fabricated sensor can be baked in a vacuum oven to resultingly form the thermoelectric material layer 204.

Thereafter, the second circuit connection portion 208, such as a second electrode, can be applied to the ionic thermoelectric material layer 204, such as by depositing a metal layer with a sputterer and/or an evaporator.

To fabricate different pillars from the structure resulting at 252 at FIG. 2, laser cutting can be employed to separate and/or remove portions of the structure 252, such as to separate and/or remove portions of the second circuit connection layer 208 and thermoelectric material layer 204.

Figure 3A:
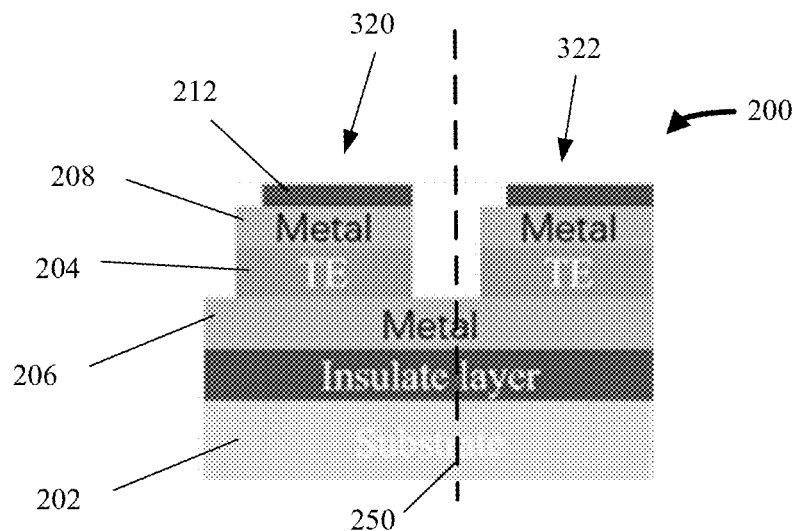
FIG. 3A illustrates a side view of another operation following from the process flow of FIG. 2, in accordance with one or more embodiments described herein.
Figure 3B:
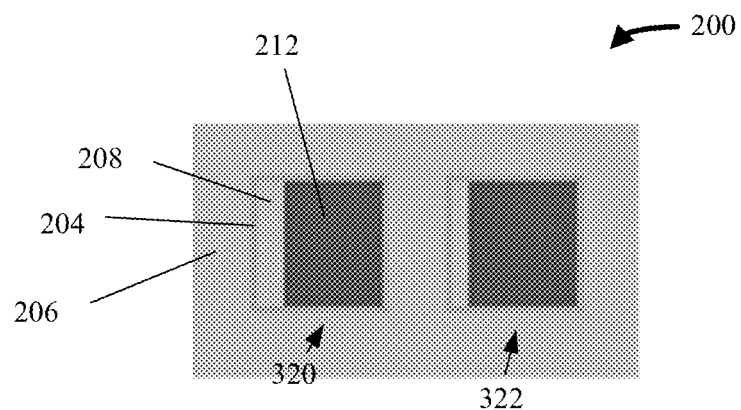
FIG. 3B illustrates a top view of the another operation of FIG. 3A, that follows from the process flow of FIG. 2, in accordance with one or more embodiments described herein.

Turning to FIGS. 3A and 3B, two different views of the resultant thermoelectric sensor 200 are provided. FIG. 3A provides a side view and FIG. 3B provides a top view, looking down at the radiation absorber(s) 212. Upon the formation of the pillars 320 and 322, a plurality of thermoelectric sensors 300 can each be a pixel in an infrared sensor or sensor array.

In one or more embodiments described herein, one or more pillars can comprise additional materials and/or layers in addition to a thermoelectric material (TE). For example, the pillars 320 and 322 each comprise a metal 208 layer and a radiation absorber 212 layer.

As illustrated the pair of pillars 320 and 322 can each extend in a common direction from the substrate 202, such as each extending along a central longitudinal axis 250. The layers of the pillars 320 and 322 can thus comprise vertical stacks stacked along the central longitudinal axis 250.

At FIGS. 3A and 3B, it is noted that the first circuit connection layer 206 is not separated into pillars, and thus is common to each of the pillars 320 and 322.

Figure 4:
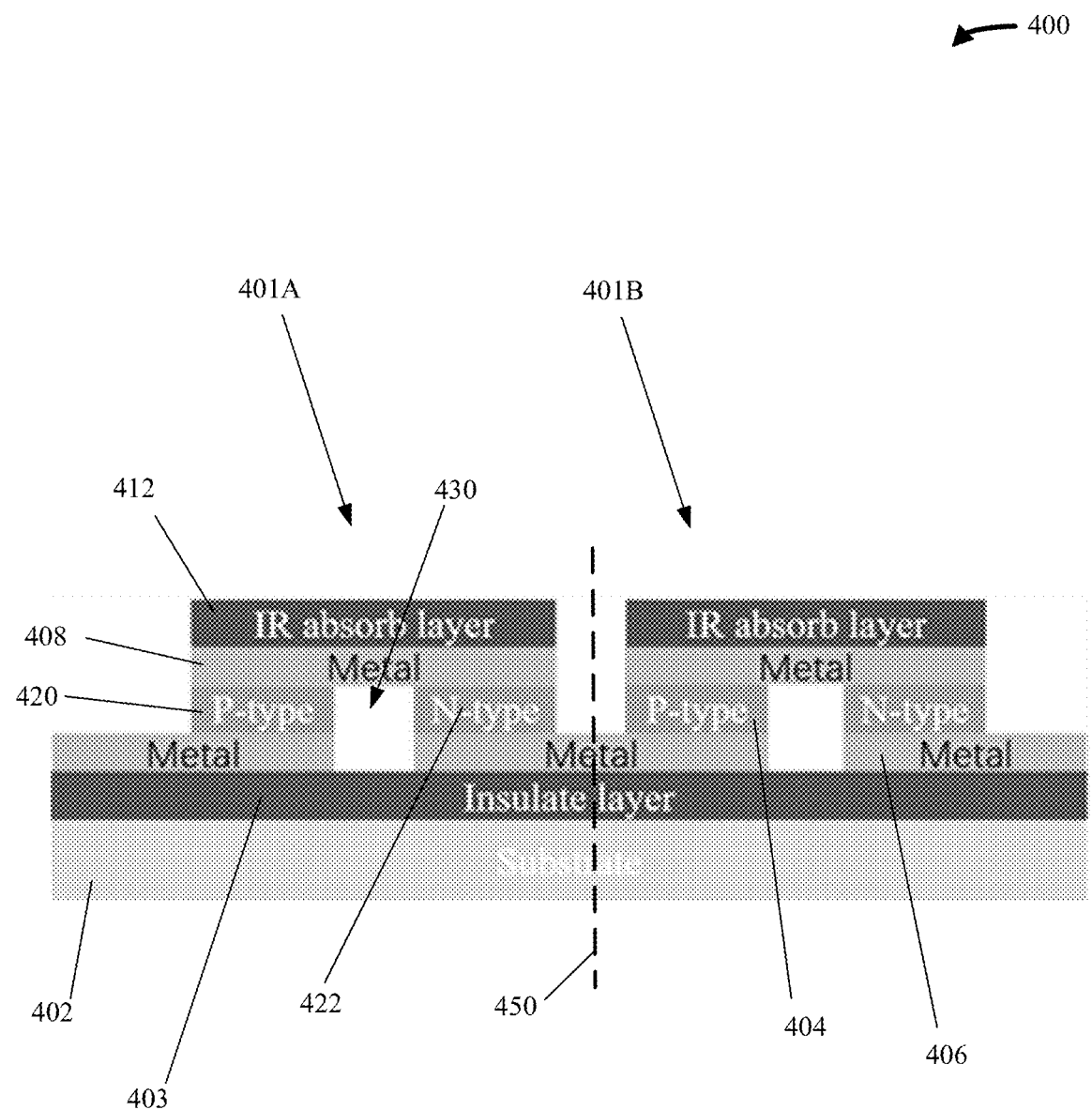
FIG. 4 illustrates a side view of a different operation following from the process flow of FIG. 2, in accordance with one or more embodiments described herein.

Looking next to FIG. 4, an alternate embodiment of a thermoelectric sensor 400 is illustrated. Different from the thermoelectric sensor 200, the thermoelectric sensor 400 includes a pair of pillars 420/422 and also includes different separations of the individual pillars of a pair from one another.

That is, referring to one pair of pillars 420 and 422, the thermoelectric material layer 404 and first circuit connection portion 406 can be separated into pillars 420 and 422. This operation can be performed prior to the application of the second circuit connection layer 408 and the radiation absorber layer 412.

As shown, various elements/layers can be considered different separate and/or joined pillars (ionic sensing units). For example, first and second pillars can comprise the IR absorb layer 412, metal layer 408, thermoelectric materials 404 (both an n-type and a p-type). These pillars can be joined at a lower metal layer 406 to one another. Accordingly, these pillars can be at least partially separated and/or spaced apart from one another along the substrate 402 along a partial distance along a central longitudinal axis 450 (e.g., along the layers 406, 408 and 412).

Put another way, the four illustrated p-type and n-type materials 404 can be considered separate pillars 420, 422, and so on. These pillars can be joined in series by metal layers 408 and 406 to enhance output signal strength of the respective device/sensor.

In one or more other embodiments, either of the thermoelectric material layer 404 and/or the first circuit connection layer 406 can be layered in their respectively illustrated portions, such as absent use of laser cutting to form the illustrate pillars. In one or more embodiments, both n-type and p-type ionic thermoelectric materials can be separately printed to form the thermoelectric material layer 404 as spaced-apart pillar portions 420 and 422.

As illustrated, each of the second circuit connection layer 408 and the radiation absorber layer 412 can be separately applied to individual (e.g., respective) pillars (e.g., a p-type pillar and an n-type pillar) of a pair of the pillars. In one or more embodiments, the second circuit connection layer 408 and/or the radiation absorber layer 412 can be common to each of the pillars of a pair, and thus laser cutting of the second circuit connection layer 408 and the radiation absorber layer 412 can be omitted. In one or more embodiments, the radiation absorber layer 412 and/or a silver ink layer can be applied via three-dimensional printing.

In one or more embodiments, a support material (not shown) can be inserted and/or otherwise applied, such as between the pillars 420, 422 at location 430, such as after laser cutting to form the pillars 420, 422. In one or more embodiments, such structural support material can abut the n-type and p-type thermoelectric material of the pillars 420 and/or 422.

Turning now to FIGS. 5 to 12, additional embodiments of thermoelectric sensors generally in accordance with the aforementioned embodiments 100 and/or 200 will now be described. Repetitive description of like elements and/or processes employed in respective embodiments is omitted for sake of brevity.

Figure 5:
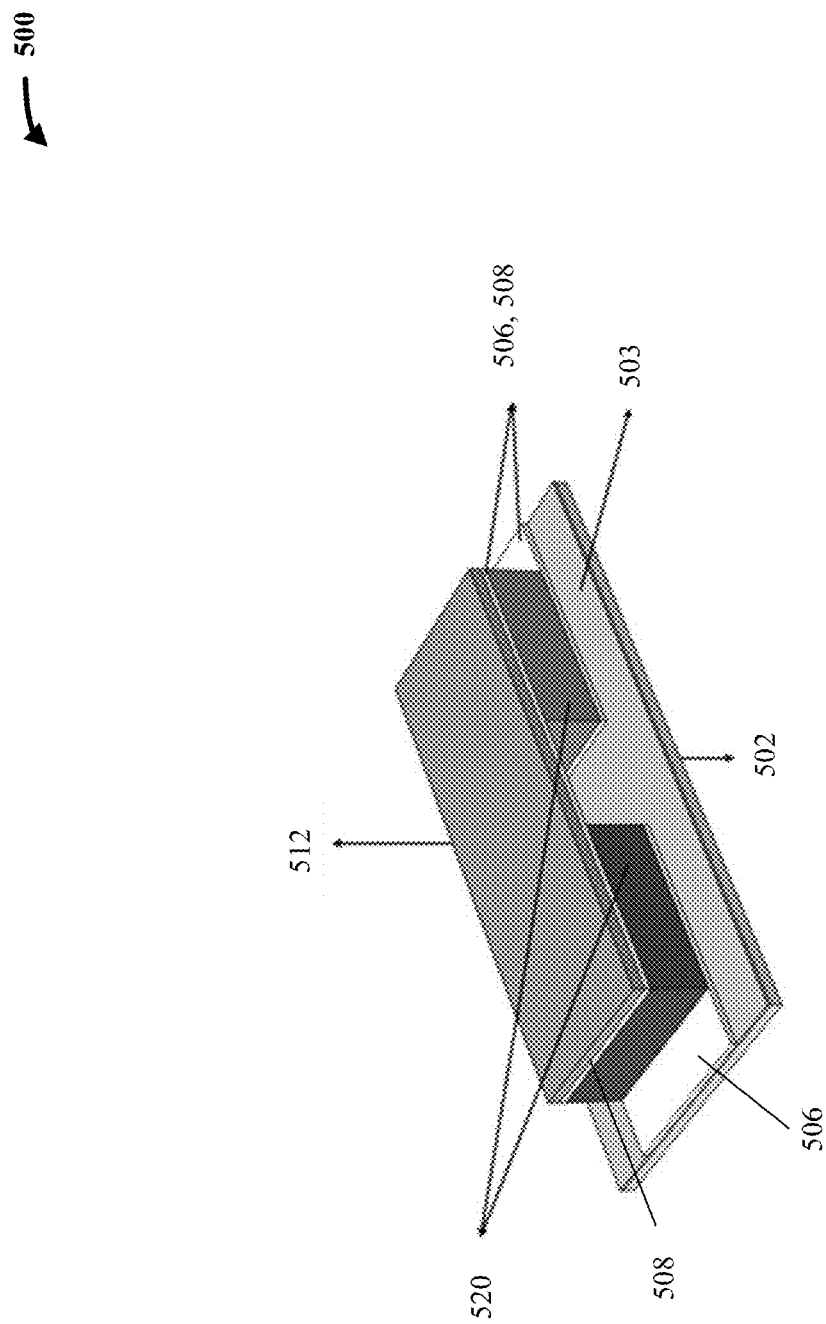
FIG. 5 illustrates a side orthogonal view of an exemplary thermoelectric sensor, in accordance with one or more embodiments described herein.

FIG. 5 illustrates a thermoelectric sensor 500 comprising a substrate 502 and an insulation layer 503 on the substrate 502, spaced apart first connection sections 506, individual, spaced apart n-type and p-type pillars 520, a second connection portion 508 common to the two pillars 520 and a radiation absorber 512 also common to the two pillars 520. The second connection portion 508 can electrically connect the two pillars 520.

Figure 6:
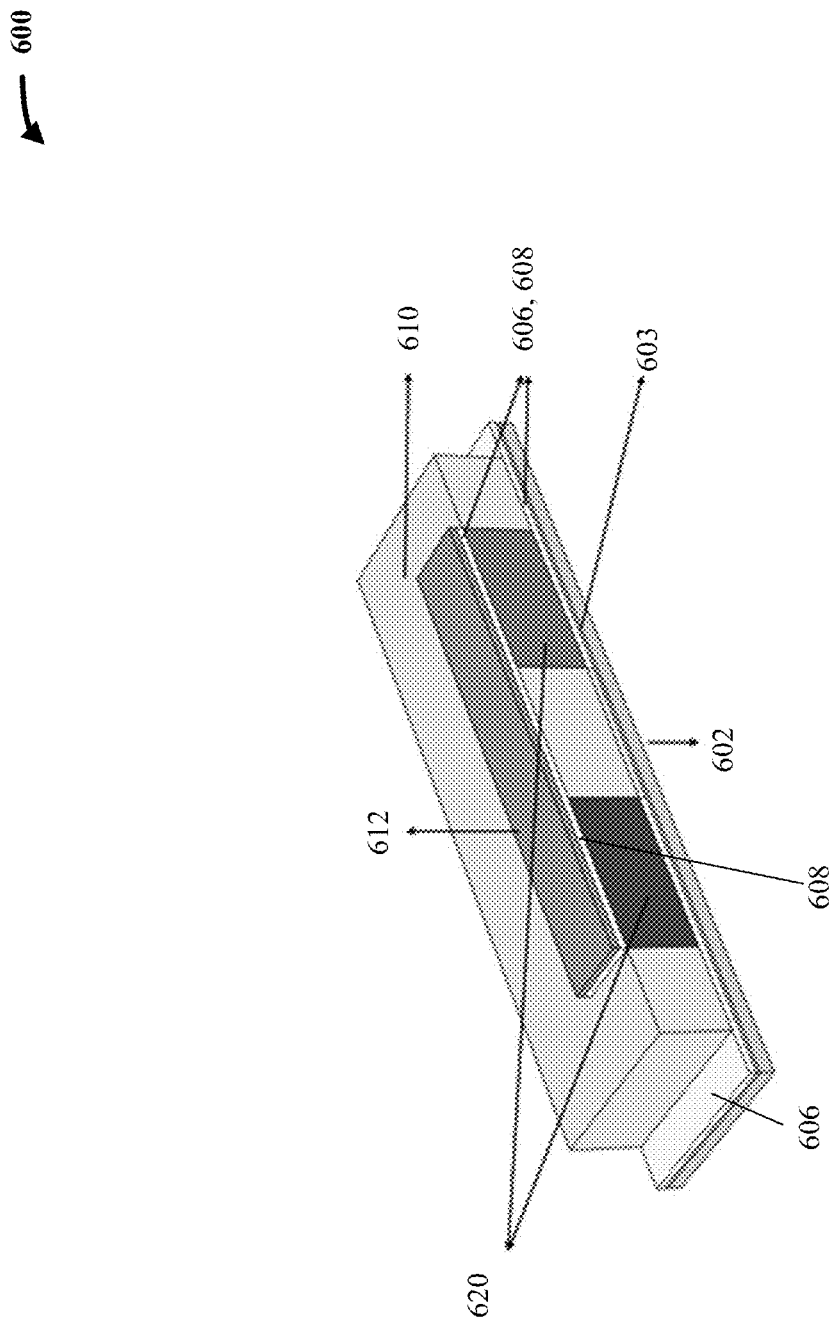
FIG. 6 illustrates a side orthogonal view of an exemplary thermoelectric sensor, in accordance with one or more embodiments described herein.

FIG. 6 illustrates a thermoelectric sensor 600 comprising a substrate 602 and an insulation layer 603 on the substrate 602, spaced apart first connection sections 606, individual, spaced apart n-type and p-type pillars 620, a second connection portion 608 common to the two pillars 620 and a radiation absorber 612 also common to the two pillars 620. The second connection portion 608 connects the two pillars 620. A support 610, such as a structural support, is disposed between the pillars 620 and generally around the pillars 620, such as to support the thermoelectric material(s) of the pillars 620.

Figure 7:
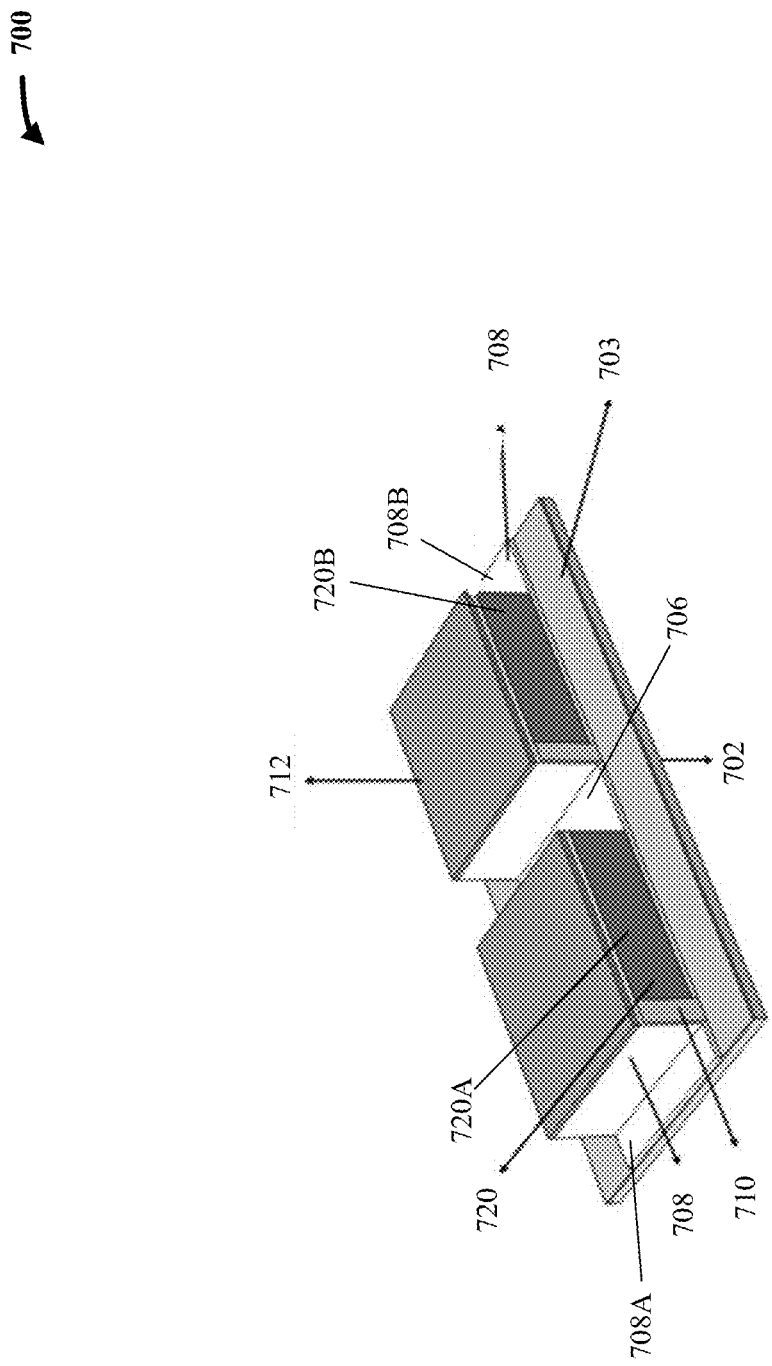
FIG. 7 illustrates a side orthogonal view of an exemplary thermoelectric sensor, in accordance with one or more embodiments described herein.

FIG. 7 illustrates a thermoelectric sensor 700 comprising a substrate 702 and an insulation layer 703 on the substrate 702, a connection portion 706, individual, spaced apart pillars 720, incomplete (e.g., partial) additional connection portions 708 and separate radiation absorbers 512. The radiation absorbers 712 are not common to the two pillars 720.

The pillars 720 each can comprise a same p-type and/or n-type thermoelectric material.

The connection portion 706 is two tiered in that it can electrically connect an underside of the pillar 720A (e.g., between the pillar 720A and the insulation layer 703) to a top side of the pillar 720B (e.g., between the pillar 720B and the respective radiation absorber 712).

One additional connection portion 708A is partially provided at the first pillar 720A, and thus can allow for electrical connection to a pillar of another thermoelectric sensor (e.g., a second thermoelectric sensor). Another additional connection portion 708B is partially provided at the second pillar 720B, and thus can allow for electrical connection to yet another pillar of yet another thermoelectric sensor (e.g., a third thermoelectric sensor).

Dielectric material 710 can be disposed abutting each pillar 720A and 720B. The dielectric material 710 also can abut a pair of connection portions, such as the labeled connection portions 706 and 708A. In one or more embodiments, the dielectric material 710 can act as an insulating layer. Relative to FIG. 7, the dielectric material 710 can prevent shorting at side walls of the top and bottom walls where electric potential at walls is the same.

Figure 8:
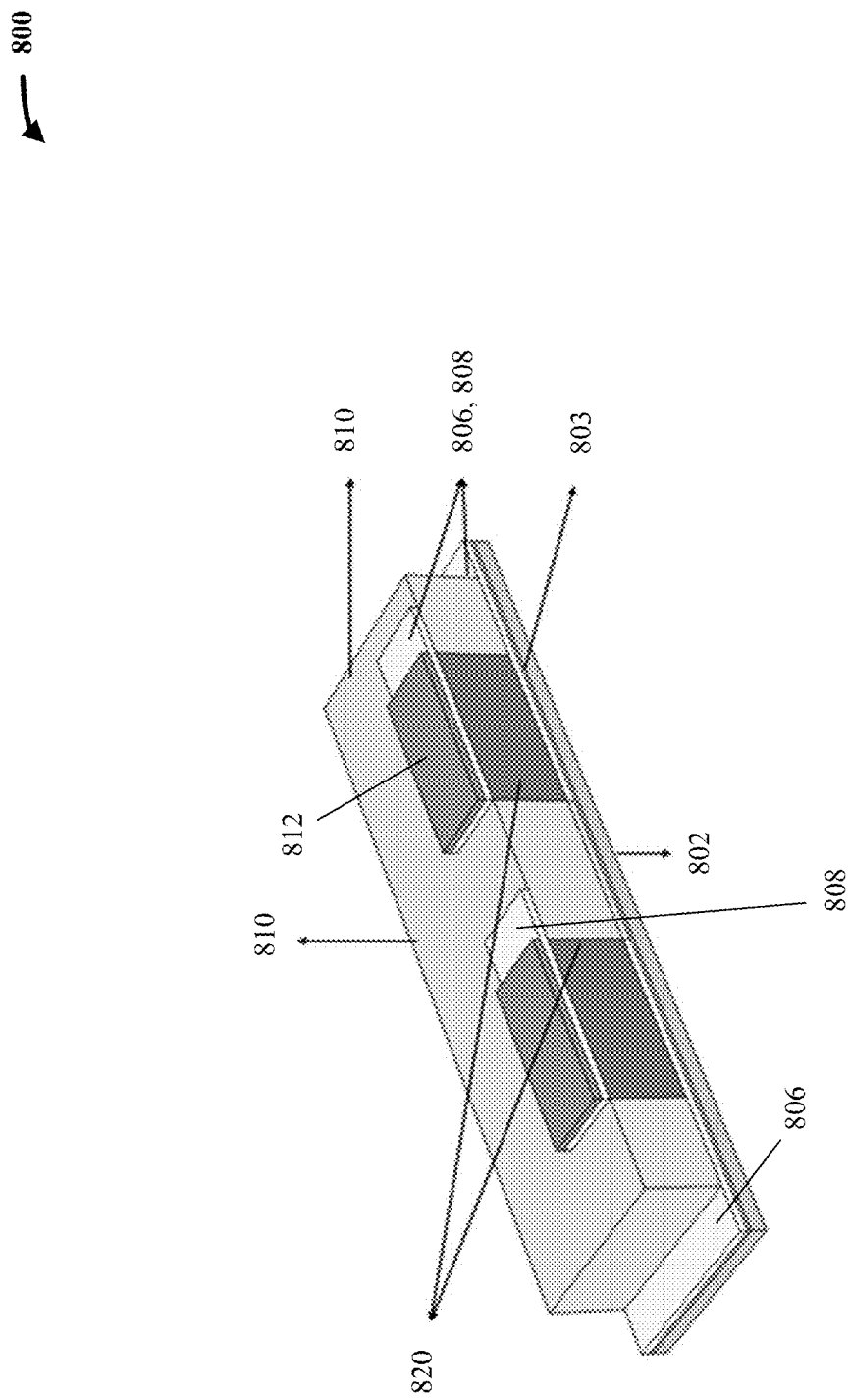
FIG. 8 illustrates a side orthogonal view of an exemplary thermoelectric sensor, in accordance with one or more embodiments described herein.

FIG. 8 illustrates a thermoelectric sensor 800 comprising a base substrate 802 and an insulation layer 803 on the substrate 802, spaced apart first connection sections 806, individual, spaced apart pillars 820, individual second connection portions 808 and individual radiation absorbers 812. The second connection portions 808 do not connect the two pillars 820. The second connection portions 808 and the radiation absorbers 812 are not common to the two pillars 820. A support 810, such as a structural support, can be disposed between the pillars 820 and generally around the pillars 820, such as to support the thermoelectric material(s) of the pillars 820.

The pillars 820 each can comprise a same p-type or n-type thermoelectric material.

Figure 9:
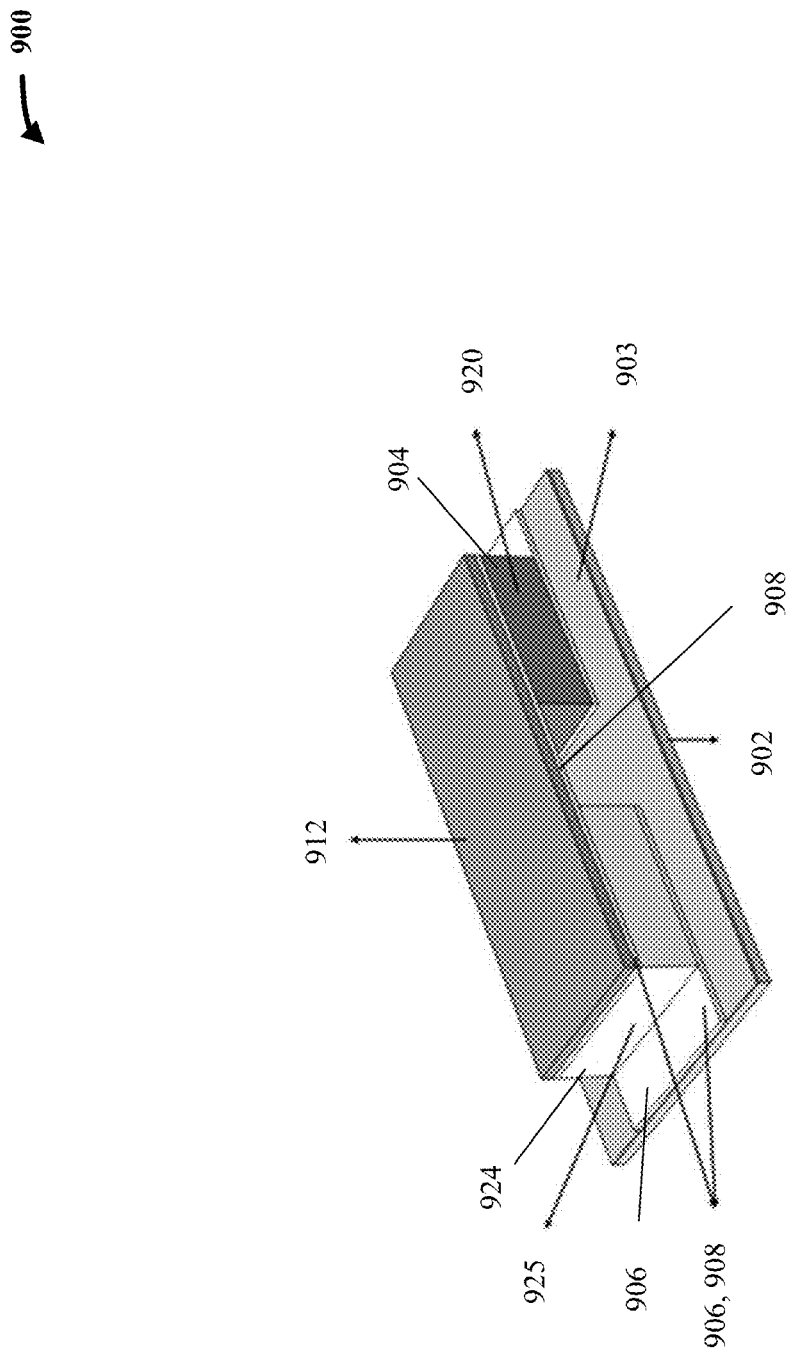
FIG. 9 illustrates a side orthogonal view of an exemplary thermoelectric sensor, in accordance with one or more embodiments described herein.

FIG. 9 illustrates a thermoelectric sensor 900 comprising a substrate 902 and an insulation layer 903 on the substrate 902, individual first connection portions 906, individual, spaced apart pillars 920 and 925, a second connection portion 908 common to the two pillars 920 and 925 and a radiation absorber 912 also common to the two pillars 920 and 925. The second connection portion 908 can electrically connect the two pillars 920 and 925. The pillar 920 can comprise a thermoelectric material 904, such as an ionic thermoelectric material. The pillar 925 can comprise an electrically conductive material 924 different from the thermoelectric material 904.

Figure 10:
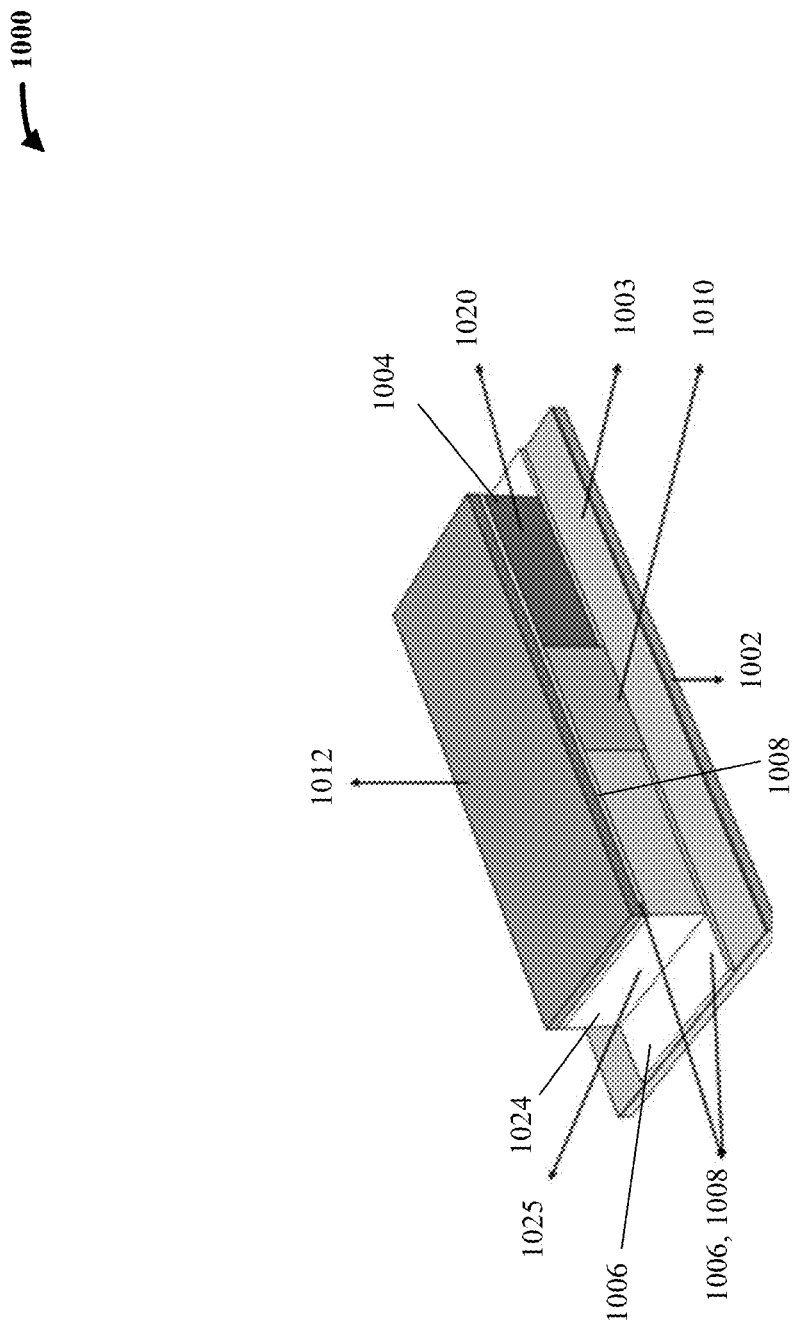
FIG. 10 illustrates a side orthogonal view of an exemplary thermoelectric sensor, in accordance with one or more embodiments described herein.

FIG. 10 illustrates a thermoelectric sensor 1000 comprising a substrate 1002 and an insulation layer 1003 on the substrate 1002, individual first connection portions 1006, individual, spaced apart pillars 1020 and 1025, a second connection portion 1008 common to the two pillars 1020 and 1025 and a radiation absorber 1012 also common to the two pillars 1020 and 1025. The second connection portion 1008 can electrically connect the two pillars 1020 and 1025. The pillar 1020 can comprise a thermoelectric material 1004, such as an ionic thermoelectric material. The pillar 1025 can comprise an electrically conductive material 1024 different from the thermoelectric material 1004.

Further, different from the thermoelectric sensor 900, the thermoelectric sensor 1000 comprises a support 1010. The support 1010 can be included for structurally supporting any one or more of the components of the thermoelectric sensor 1000, such as the second circuit connection portion 1008, the first pillar 1020, the second pillar 1025 and/or the radiation absorber 1012. The support 1010 can abut and/or be in direct contact with any one of the first pillar 1020, second pillar 1025, insulation layer 1003 and/or second circuit connection portion 1008.

Figure 11:
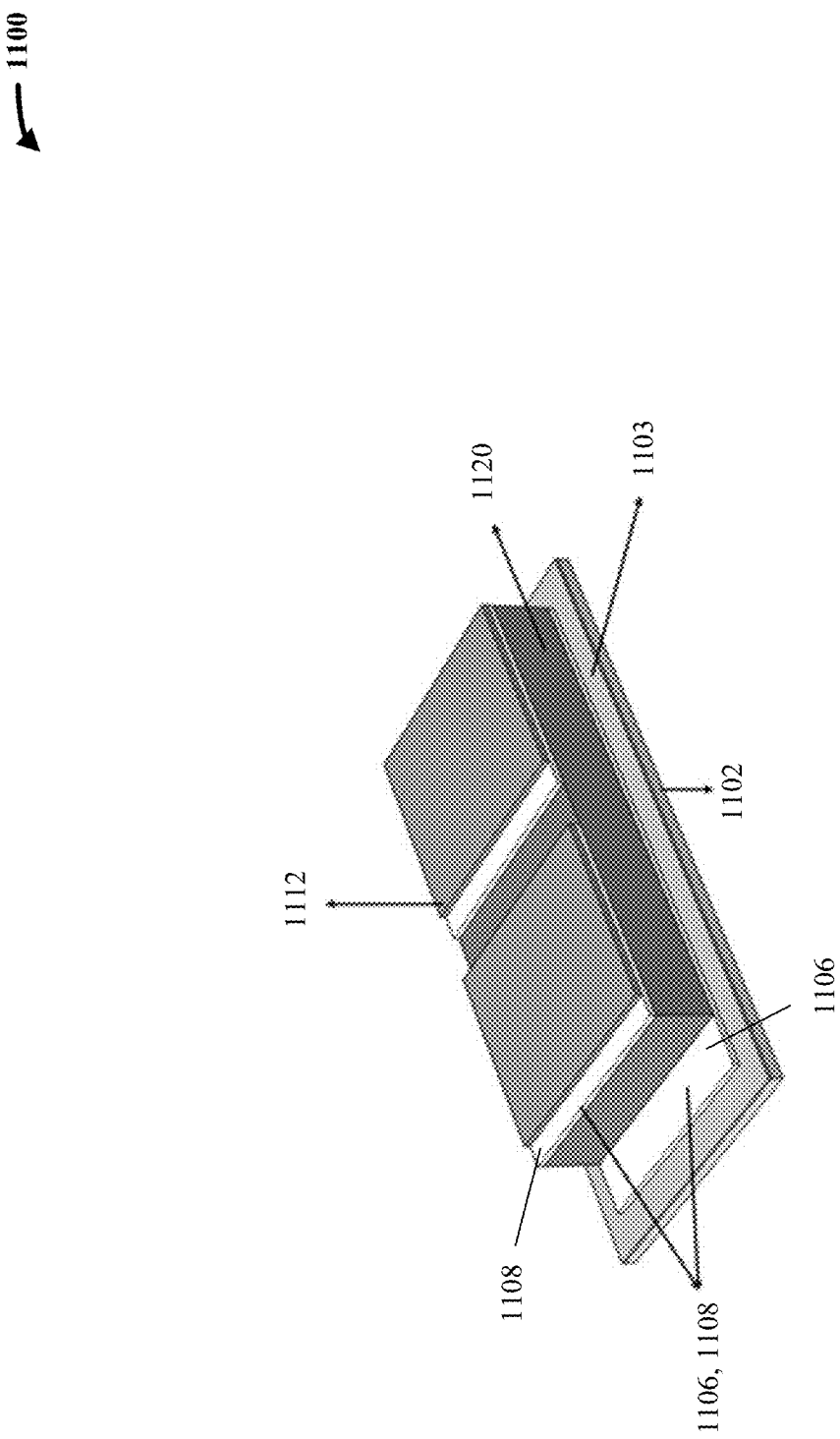
FIG. 11 illustrates a side orthogonal view of an exemplary thermoelectric sensor, in accordance with one or more embodiments described herein.

FIG. 11 illustrates a thermoelectric sensor 1100 comprising a substrate 1102, an insulation layer 1103 on the substrate 1102, a first connection portion 1106, a single thermoelectric pillar 1120, separated second connection portions 1108 and separated radiation absorbers 1112. The single thermoelectric pillar 1120 can comprise a p-type or n-type thermoelectric material. The second connection portions 1108 can be spaced apart from one another along a top surface (e.g., opposite the first connection portion 1106) of the single thermoelectric pillar 1112.

Figure 12:
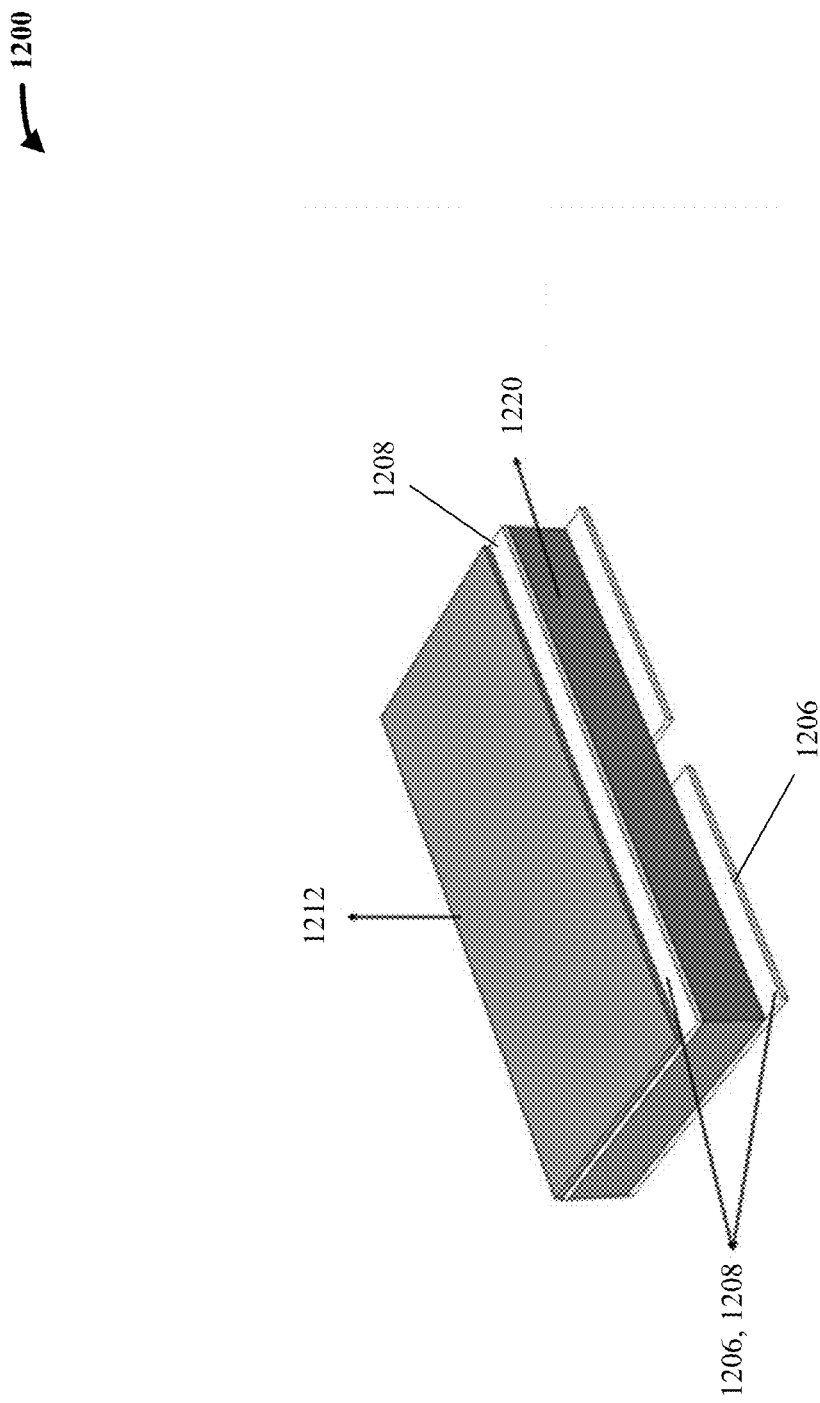
FIG. 12 illustrates a side orthogonal view of an exemplary thermoelectric sensor, in accordance with one or more embodiments described herein.

FIG. 12 illustrates a thermoelectric sensor 1200 comprising spaced apart first connection portions 1206, a single thermoelectric pillar 1220, a single second connection portion 1208 and a single radiation absorber 1212. The single thermoelectric pillar 1220 can comprise a p-type or n-type thermoelectric material. The first connection portions 1206 can be spaced apart from one another along a bottom surface (e.g., opposite the second connection portion 1208) of the single thermoelectric pillar 1212.

In one or more embodiments, the thermoelectric sensor 1200 also can comprise a substrate and an insulation layer on the substrate, with the first connection portions 1206 layered on the insulation layer.

Figure 13:
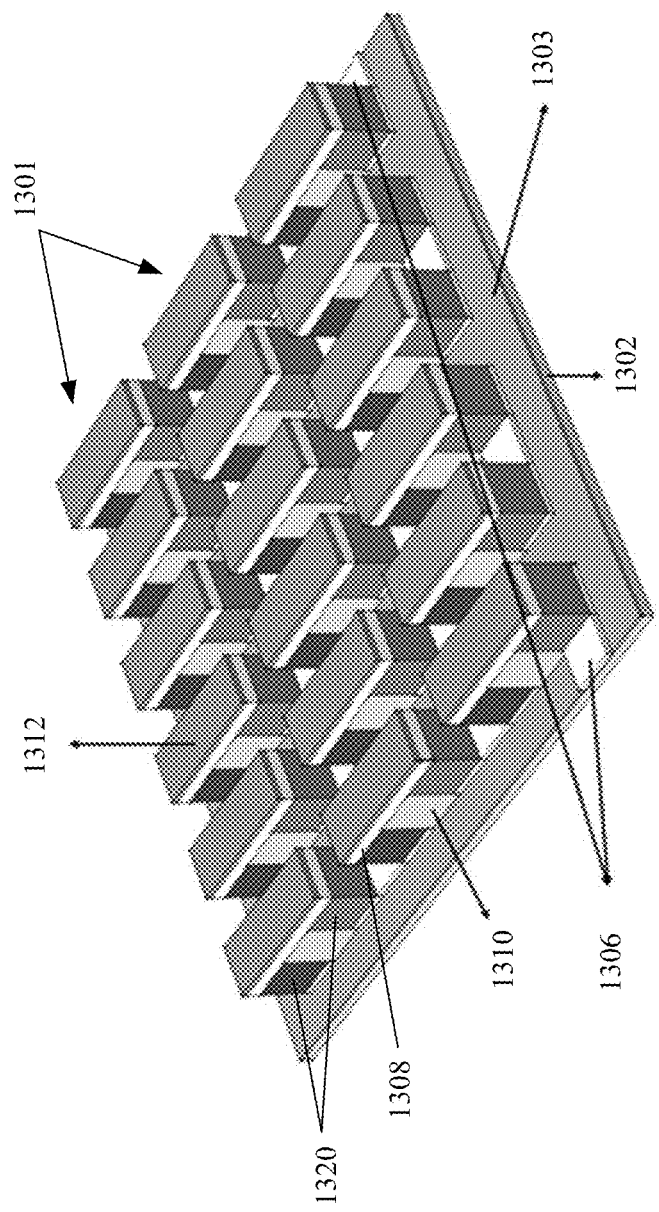
FIG. 13 illustrates a side orthogonal view of an exemplary sensor array, in accordance with one or more embodiments described herein.
Figure 14:
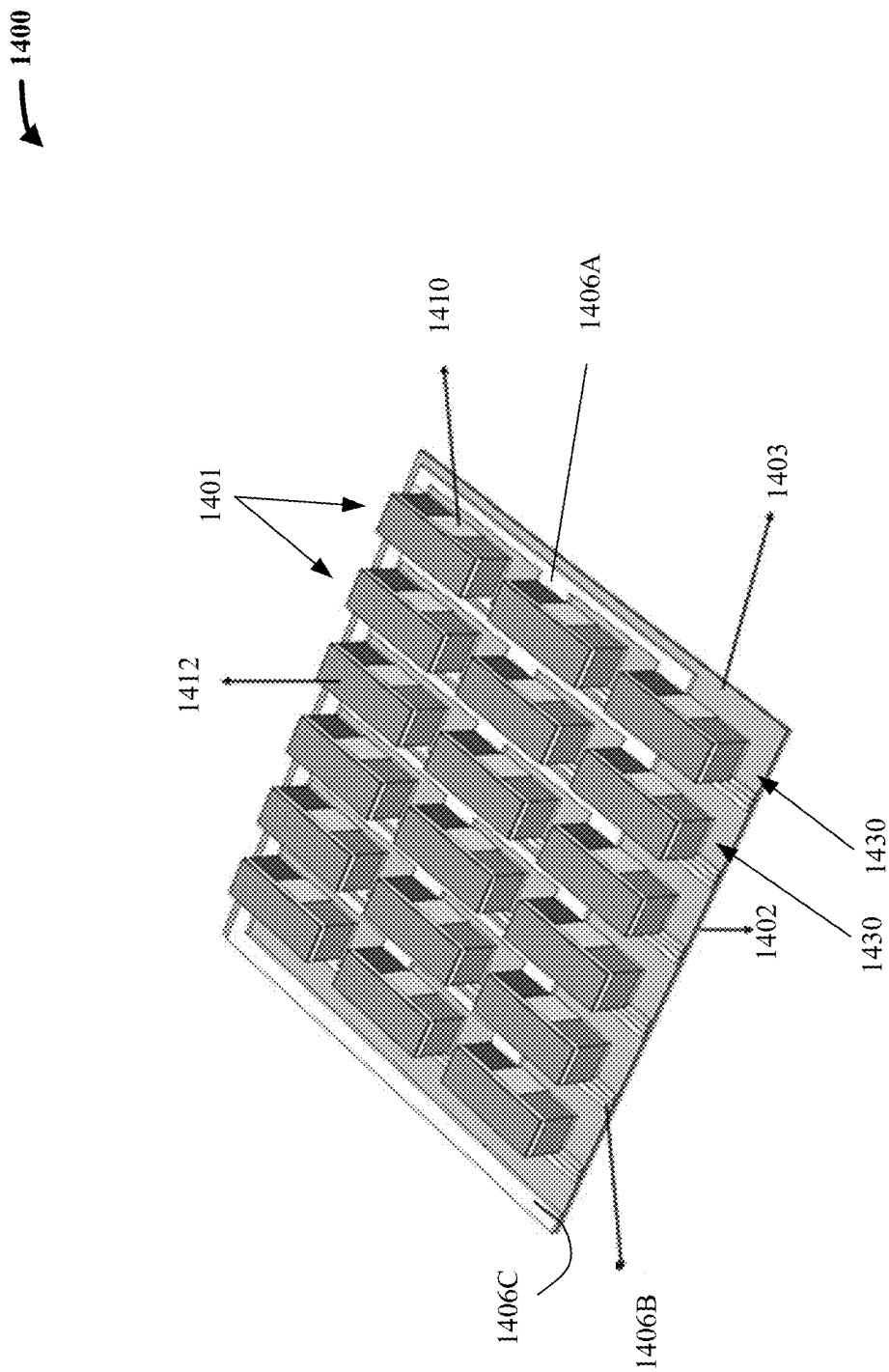
FIG. 14 illustrates a side orthogonal view of an exemplary sensor array, in accordance with one or more embodiments described herein.
Figure 15:
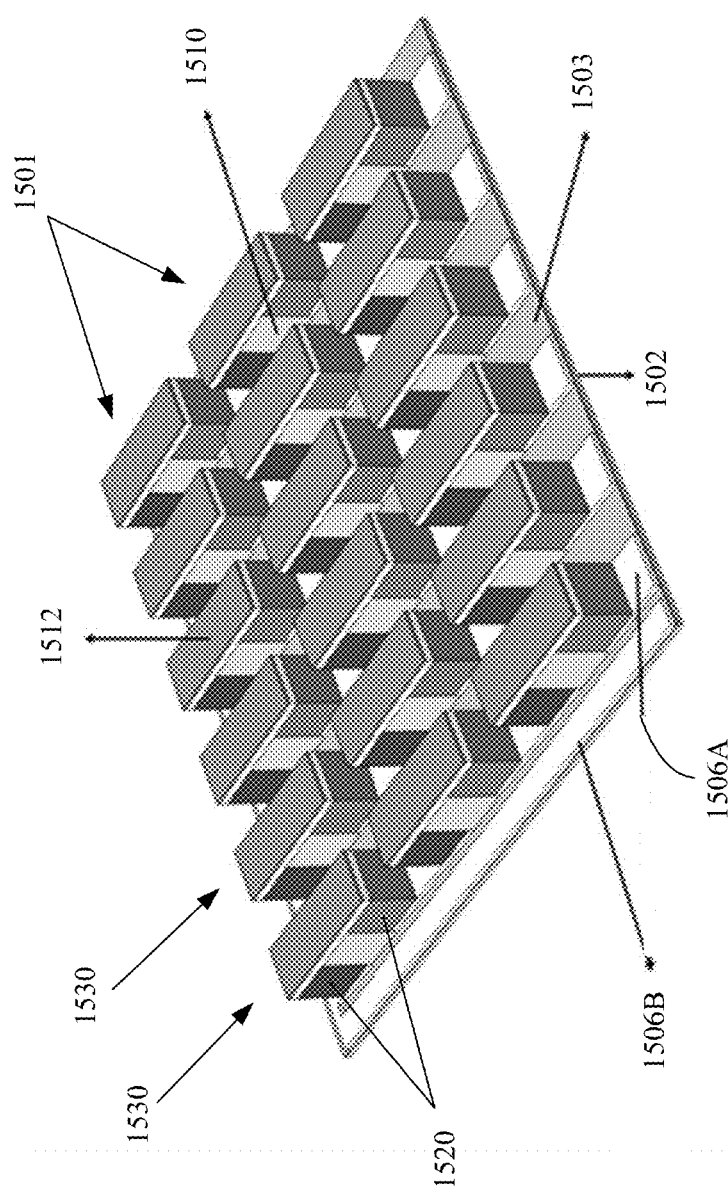
FIG. 15 illustrates a side orthogonal view of an exemplary sensor array, in accordance with one or more embodiments described herein.

Referring next to FIGS. 13 to 15, various sensor arrays are illustrated that can employ thermoelectric sensors as aforedescribed in an array. While each of FIGS. 13 to 15 illustrates use of a plurality of thermoelectric sensors 100 as illustrated at FIG. 1, any one or more other thermoelectric sensors as described herein can be arranged in a sensor array. In one or more embodiments, a sensor array can include mixed types of thermoelectric sensors (e.g., two or more different types of thermoelectric sensors as described herein) and/or all common types of sensors (e.g., sensors 100, 200, 400, 500, 600, 700, 800, 900, 1000, 1100 and/or 1200).

At each of the sensor arrays 1300, 1400 and 1500 of the FIGS. 13, 14 and 15, each sensing unit (e.g., thermoelectric sensor) can serve as a single pixel of an overall imaging sensor comprising the respective sensor array 1300, 1400 or 1500.

Looking first to FIG. 13, illustrated is a sensor array 1300 comprising a plurality of thermoelectric sensors 1301. Each of the thermoelectric sensors 1301 comprises at least spaced apart pillars 1320 including a p-type pillar 1320 and an n-type pillar 1320.

The thermoelectric sensors 1301 have a common insulation layer 1303 and a common base substrate 1302. In one or more embodiments, additional insulation layers (and/or portions thereof) and/or additional substrates (and/or portions thereof) can be included.

First connection portions 1306 connect thermoelectric sensors 1301 to one another in a single connected series. In this way, one type of pillar 1320 of one thermoelectric sensor 1301 can be connected to an opposite type pillar 1320 of another thermoelectric sensor 1301. For example, an n-type pillar 1320 of one thermoelectric sensor 1301 can be electrically connected to a p-type pillar 1320 of another thermoelectric sensor 1301 by a same first connection portion 1306.

Each thermoelectric sensor 1301 has a single second connection portion 1308 disposed opposite the first connection portions 1306 connected to the thermoelectric sensor 1301. The single second connection portion 1308 electrically connects the pillars 1320 to one another.

Each thermoelectric sensor 1301 also has a single radiation absorber 1312 at both pillar 1320 and a support 1310 disposed between the pillars 1320 of each thermoelectric sensor 1301.

Looking next to FIG. 14, illustrated is a sensor array 1400 comprising a plurality of thermoelectric sensors 1401. As illustrated, each of the thermoelectric sensors 1401 has a same or similar composition as the thermoelectric sensors 1301, such as comprising a radiation absorber 1412, support 1410, and an n-type pillar and a p-type pillar. The thermoelectric sensors 1401 have a common insulation layer 1403 and a common base substrate 1402. In one or more embodiments, additional insulation layers (and/or portions thereof) and/or additional substrates (and/or portions thereof) can be included. Repetitive description of like elements and/or processes employed in respective embodiments is omitted for sake of brevity.

At FIG. 14, all thermoelectric sensors 1401 are not electrically connected in a single long series. Rather, groups 1430 of thermoelectric sensors 1401 are electrically connected in parallel to one another, with the thermoelectric sensors 1401 of each group also being electrically connected to one another in parallel.

The thermoelectric sensors 1401 of each group 1430 (at FIG. 14, each row) can be electrically connected to one another in parallel by a common connection portion 1406A electrically connected to each n-type pillar 1420 of the thermoelectric sensors 1401 of the respective group 1430. The thermoelectric sensors 1401 of each group 1430 also can be electrically connected to one another in parallel by a common connection portion 1406B electrically connected to each p-type pillar 1420 of the thermoelectric sensors 1401 of the respective group 1430. That is, for each group, the p-type pillars can be connected and the n-type pillars can be separately connected.

A connection portion 1406C can electrically connect the rows/groups 1430 to one another in parallel, such as by connecting to each connection portion 1406A.

Looking now to FIG. 15, illustrated is a sensor array 1500 comprising a plurality or thermoelectric sensors 1501. As illustrated, each of the thermoelectric sensors 1501 has a same or similar composition as the thermoelectric sensors 1301, such as comprising a radiation absorber 1512, support 1510, and an n-type pillar and a p-type pillar. The thermoelectric sensors 1501 have a common insulation layer 1503 and a common base substrate 1502. In one or more embodiments, additional insulation layers (and/or portions thereof) and/or additional substrates (and/or portions thereof) can be included. Repetitive description of like elements and/or processes employed in respective embodiments is omitted for sake of brevity.

Different from the sensor array 1400, thermoelectric sensors 1501 within groups 1530 of can be connected in series, with the groups 1530 connected to one another in parallel.

The thermoelectric sensors 1501 of each group 1530 (at FIG. 15, each row) can be electrically connected to one another in series by spaced apart connection portions 1506A. In this way, one type of pillar 1520 of one thermoelectric sensor 1501 can be connected to an opposite type pillar 1520 of another thermoelectric sensor 1501. For example, an n-type pillar 1520 of one thermoelectric sensor 1501 can be electrically connected to a p-type pillar 1520 of another thermoelectric sensor 1501 by a same connection portion 1506.

A connection portion 1506B can electrically connect the rows/groups 1530 to one another in parallel, such as by connecting to one connection portion 1506A of each group 1530.

Example Method of Manufacture

Figure 16:
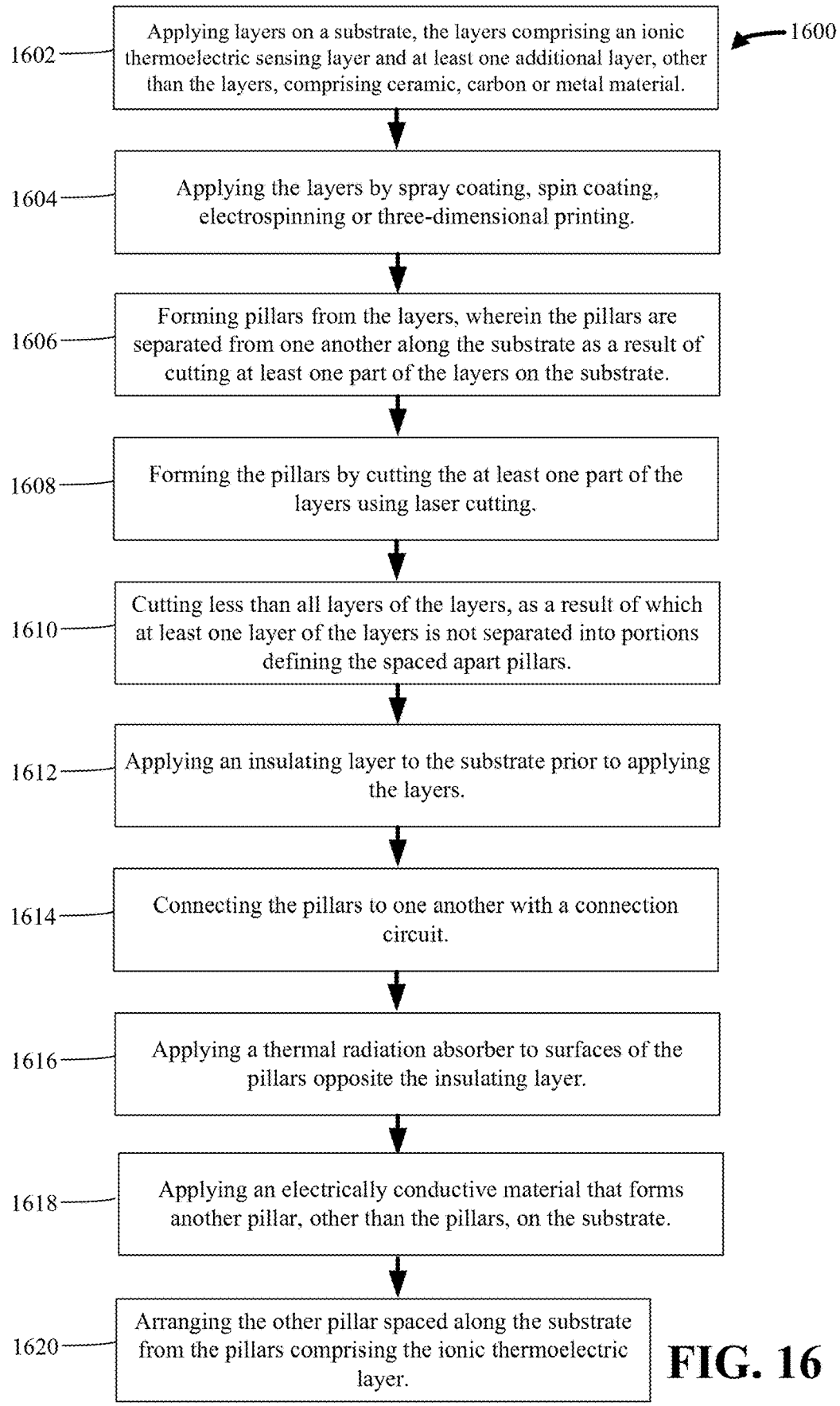
FIG. 16 illustrates a flow diagram, of an example, non-limiting method for fabricating thermoelectric sensor, in accordance with one or more embodiments described herein.

Turning now to FIG. 16, illustrated is a flow diagram of an example, non-limiting method 1600 that can facilitate a process for manufacturing (e.g., fabricating) a thermoelectric sensor, such as the thermoelectric sensor 100. While the method 1600 is described relative to the thermoelectric sensor 100, the method 1600 can be applicable also to any of the thermoelectric sensors 200, 400, 500, 600, 700, 800, 900, 1000, 1100 and/or 1200, and/or other embodiments described herein but not particularly illustrated. Repetitive description of like elements and/or processes employed in respective embodiments is omitted for sake of brevity.

Any one of the one or more operations described below can be performed by a suitable manufacturing system.

Looking first to operation 1602 at FIG. 16, the method 1600 can comprise applying layers on a substrate (e.g., substrate 102), the layers comprising an ionic thermoelectric sensing layer (e.g., ionic thermoelectric sensing layer 104) and at least one additional layer (e.g., radiation absorber 112, first circuit connection portion 106 and/or second circuit connection portion 108), other than the ionic thermoelectric layer, comprising ceramic, carbon or metal material.

At operation 1604, the method 1600 can comprise applying the layers (e.g., ionic thermoelectric sensing layer 104, radiation absorber 112, first circuit connection portion 106 and/or second circuit connection portion 108) by spray coating, spin coating, electrospinning or three-dimensional printing.

At operation 1606, the method 1600 can comprise forming pillars, such as ionic sensing units (e.g., pillars 120, 122) from the layers (e.g., ionic thermoelectric sensing layer 104), wherein the pillars (e.g., pillars 120, 122) are separated from one another along the substrate (e.g., substrate 102) as a result of cutting at least one part of the layers (e.g., ionic thermoelectric sensing layer 104) on the substrate.

At operation 1608, the method 1600 can comprise forming the pillars (e.g., pillars 420, 422) by cutting the at least one part of the layers (e.g., ionic thermoelectric sensing layer 104) using laser cutting.

At operation 1610, the method 1600 can comprise cutting less than all layers of the layers, as a result of which at least one layer (e.g., radiation absorber 112 and/or second circuit connection portion 108) of the layers is not separated into portions defining the spaced apart pillars (e.g., pillars 420, 422).

At operation 1612, the method 1600 can comprise applying an insulating layer (e.g., insulating layer 103) to the substrate (e.g., substrate 102) prior to applying the layers (e.g., e.g., ionic thermoelectric sensing layer 104, radiation absorber 112, first circuit connection portion 106 and/or second circuit connection portion 108).

At operation 1614, the method 1600 can comprise connecting the pillars (e.g., pillars 420, 422) to one another with a connection circuit (e.g., first circuit connection portion 106 and/or second circuit connection portion 108).

At operation 1616, the method 1600 can comprise applying a thermal radiation absorber (e.g., radiation absorber 112) to surfaces of the pillars (e.g., pillars 420, 422) opposite the insulating layer (e.g., insulating layer 103).

At operation 1618, the method 1600 can comprise applying an electrically conductive material (e.g., electrically conductive material 924) that forms another pillar (e.g., pillar 925), other than the pillars (e.g., pillars 1320), on the substrate. For example, relative to a combination of FIGS. 9 and 13, one or more sensors 1301 of a sensor array 1300 can comprise one pillar 920 comprising a thermoelectric material and another pillar 925, spaced apart from the one pillar 920 along a substrate 902, 1302, and comprising an electrically conductive material 924.

At operation 1620, the method 1600 can comprise arranging another pillar (e.g., another pillar 925) comprising an electrically conductive material (e.g., electrically conductive material 924) spaced along the substrate (e.g., substrate 902) from a pillar (e.g., pillar 920) comprising the ionic thermoelectric layer.

Example Method of Use

Figure 17:
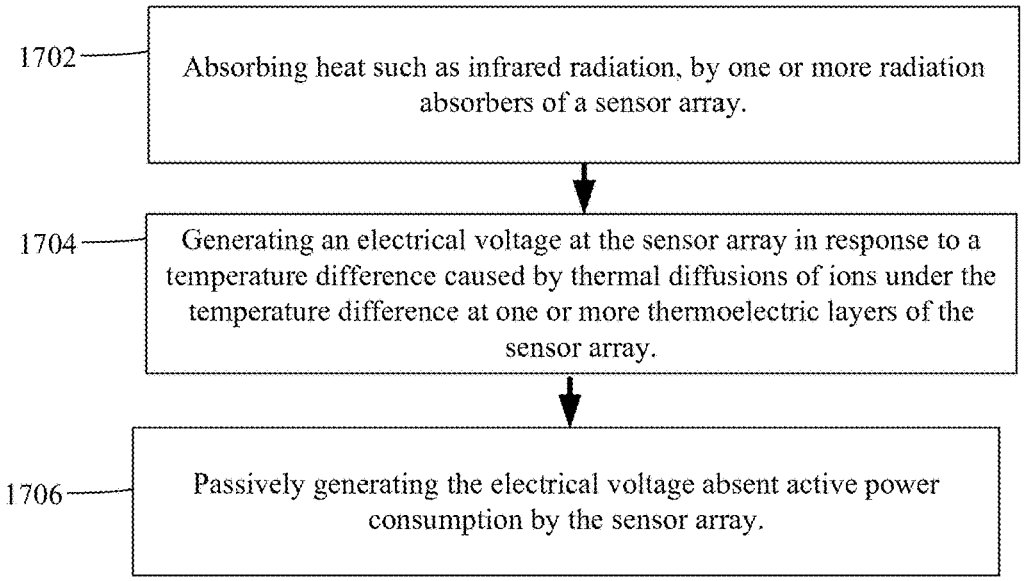
FIG. 17 illustrates a flow diagram, of an example, non-limiting method for a sensor array, in accordance with one or more embodiments described herein.

Turning now to FIG. 17, illustrated is a flow diagram of an example, non-limiting method 1700 that can facilitate a process for use of a (e.g., fabricating) thermoelectric sensor array, such as the thermoelectric sensor array 1300. While the method 1700 is described relative to the thermoelectric sensor array 1300, the method 1700 can be applicable also to any of the thermoelectric sensor arrays 1400 and/or 1500, and/or other embodiments described herein but not particularly illustrated. Repetitive description of like elements and/or processes employed in respective embodiments is omitted for sake of brevity.

Looking first to operation 1702 at FIG. 17, the non-limiting method 1700 can comprise absorbing heat such as infrared radiation, by one or more radiation absorbers (e.g., radiation absorber(s) 1312) of a sensor array (e.g., sensor array 1300).

At operation 1704, the non-limiting method 1700 can comprise generating an electrical voltage at the sensor array (e.g., sensor array 1300) in response to a temperature difference caused by thermal diffusions of ions under the temperature difference at one or more thermoelectric layers (e.g., thermoelectric layers 1304) of the sensor array (e.g., sensor array 1300).

At operation 1706, the non-limiting method 1700 can comprise passively generating the electrical voltage absent active power consumption by the sensor array (e.g., sensor array 1300).

CONCLUSION

For simplicity of explanation, the methodologies provided herein are depicted and/or described as a series of acts. It is to be understood and appreciated that the subject innovation is not limited by the acts illustrated and/or by the order of acts, for example, acts can occur in one or more orders and/or concurrently, and with other acts not presented and described herein. Furthermore, not all illustrated acts can be utilized to implement the methodologies in accordance with the described subject matter. In addition, those skilled in the art will understand and appreciate that the methodologies could alternatively be represented as a series of interrelated states via a state diagram or events.

In summary, one or more devices, systems, apparatuses, methods of manufacture and/or methods of use to facilitate thermal sensing in a field related to thermal radiation are envisioned. In one embodiment, an ionic thermoelectric thermal radiation sensor, comprises a substrate, an ionic thermoelectric sensing unit arranged on the substrate and comprising ionically conductive and electrically insulating material, wherein the ionic thermoelectric sensing unit is a voltage-producing unit having first and second surfaces spaced apart from and disposed opposite to one other, wherein the ionic thermoelectric sensing unit produces voltage via thermal diffusion of ions or via the Soret effect under a temperature difference between the first and second surfaces, a thermal radiation absorber that generates heat when exposed to thermal radiation, and one or more electrical connectors that connect the first and second surface.

A thermoelectric sensor (e.g., ionic thermoelectric thermal radiation sensor) can comprise a substrate and pillars arranged over the substrate and spaced from one another. The pillars can comprise an ionic sensing layer comprising at least one ionically conductive material absent electrically conductive materials. A connection circuit can connect the pillars to one another along the substrate. A first connection circuit portion can be layered between the substrate and the pillars, and a second connection circuit portion can be layered on the pillars opposite the first connection circuit. The pillars can comprise layers of the ionically conductive material and ceramic, carbon or metal. The ionically conductive material can comprise negative and positive type ion-conducting polymer gel or ion-conducting polymer composite. The substrate can comprise silicon, polyimide or polyethylene. The pillars can have individual widths along the substrate in a range from 0.1 µm to 100 µm. Respective thermal radiation absorbers can be arranged on the pillars opposite the substrate. A dielectric material can be arranged on the substrate and connected to at least one of the pillars. At least a first pillar of the pillars can comprise an electrically conductive material and can be spaced along the substrate from a second pillar of the pillars comprising the ionically conductive material. The thermoelectric sensor can be part of an array of spaced apart thermoelectric sensors arranged in spaced apart rows along a base of the array.

A method for fabricating a thermoelectric sensor can comprise applying layers on the substrate, the layers comprising an ionic thermoelectric layer and at least one additional layer, other than the ionic thermoelectric layer, comprising ceramic, carbon or metal material, and forming pillars from the layers, wherein the pillars are separated from one another along the substrate as a result of cutting at least one part of the layers on the substrate. The method can comprise applying the layers by spray coating, spin coating, electrospinning or three-dimensional printing, herein the forming of the pillars comprises forming the pillars by cutting the at least one part of the layers using laser cutting. The method can comprise applying an electrically conductive material that forms another pillar, other than the pillars, on the substrate, and arranging the other pillar spaced along the substrate from a pillar comprising the ionic thermoelectric layer. The method can comprise applying an insulating layer to the substrate prior to applying the layers, applying a thermal radiation absorber to surfaces of the pillars opposite the insulating layer, and connecting the pillars to one another with a connection circuit. The cutting of the at least one part of the layers can comprise cutting less than all layers of the layers, as a result of which at least one layer of the layers is not separated into portions defining the spaced apart pillars.

A sensor array can comprise a substrate and thermoelectric pillars, the thermoelectric pillars comprising negative type polymeric thermoelectric pillars, and positive type polymeric thermoelectric pillars, wherein the negative type polymeric thermoelectric pillars and the positive type polymeric thermoelectric pillars are connected to one another along the substrate, wherein respective thermal radiation absorbers are arranged on pairs of the pillars, and wherein the pairs of the pillars comprise a respective negative type polymeric thermoelectric pillar of the negative type polymeric thermoelectric pillars and a respective positive type polymeric thermoelectric pillar of the positive type polymeric thermoelectric pillar. The negative type polymeric thermoelectric pillars and the positive type polymeric thermoelectric pillars can be connected to one another in series. At least one pair of the pairs further can comprise at least one individual support structure adjacent the respective negative and the respective positive type polymeric thermoelectric pillars comprised in the at least one pair. The pairs of the pillars can comprise respective passivity sensors that can generate respective voltages due to respective thermal diffusions of ions under respective temperature differences.

In view of one or more features of one or more embodiments described herein, the one or more embodiments of a thermal radiation sensor and/or thermoelectric sensor array can provide one or more of the characteristics of high responsivity, good flexibility, small feature size and/or low cost, which can have broad application in one or more fields related to thermal radiation, such as thermal imaging, night vision, non-destructive flaw analysis, biological monitoring and/or wearable devices.

Further, such thermal radiation sensor can be fabricated by a simple and cost-effective fabrication process. The one or more heat generation layers and/or sensing layers can be fabricated by spin coating and/or spray coating. Three-dimensional printing, electrospinning can also be applied to fabricate structures with a high resolution of several micrometers. A laser cutting method can be applied to isolate pillars from one another. Such polymer-based sensors can be fabricated by a variety of facile methods having low cost, counter to existing photolithography fabrication.

The systems and/or devices have been (and/or will be further) described herein with respect to interaction between one or more components. It should be appreciated that such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

The word "example" or "exemplary" is used herein to mean serving as an example, instance, or illustration. Any embodiment or design described herein as "exemplary" is not necessarily to be construed as preferred or advantageous over other embodiments or designs. Rather, use of the word exemplary is intended to present concepts in a concrete fashion. As used in this application, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What has been described above includes examples of the present specification. It is, of course, not possible to describe every conceivable combination of components or methods for purposes of describing the present specification, but one of ordinary skill in the art may recognize that many further combinations and permutations of the present specification are possible. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. An ionic thermoelectric thermal radiation sensor, comprising:
   a substrate;
   an ionic thermoelectric sensing unit arranged on the substrate and comprising ionically conductive and electrically insulating material, wherein the ionic thermoelectric sensing unit is a voltage-producing unit having a first surface and a second surface spaced apart from and disposed opposite to one another, wherein the ionic thermoelectric sensing unit is configured to produce voltage via thermal diffusion of ions or via the Soret effect under a temperature difference between the first and second surfaces,
   wherein the ionic thermoelectric sensing unit comprises a pair of elements spaced apart from one another along the substrate, and
   wherein the pair of elements comprises a first element comprising a negative type thermoelectric material and a second element comprising a positive type thermoelectric material;
   a thermal radiation absorber applied to at least one element of the pair of elements of the ionic thermoelectric sensing unit, wherein the thermal radiation absorber is configured to generate heat when exposed to thermal radiation, including infrared radiation;
   a first electrical connector that connects respective first surface portions of a first surface of the pair of elements and a second electrical connector that connects respective second surface portions of a second surface of the pair of elements,
   wherein the first electrical connector is disposed between the respective first surface portions and the thermal radiation absorber, and
   wherein the thermal radiation absorber and the substrate are spaced apart from one another by the pair of elements; and
   a support positioned to support the first electrical connector opposite the substrate,
   wherein the support extends between the pair of elements and between the first electrical connector and the substrate, and
   wherein the support is comprised of the negative type thermoelectric material or the support is comprised of the positive type thermoelectric material.

2. The ionic thermoelectric thermal radiation sensor of claim 1,
   wherein the ionic sensing unit comprises polymer-based solid or gel electrolytes.

3. The ionic thermoelectric thermal radiation sensor of claim 1, wherein the first and second electrical connectors comprise electrically conductive materials comprising at least one of a metal, a semiconductor, a conductive polymer or a conductive ceramic.

4. The ionic thermoelectric thermal radiation sensor of claim 1, disposed in an array of spaced apart ionic thermoelectric thermal radiation sensors, including the ionic thermoelectric thermal radiation sensor, wherein the spaced apart ionic thermoelectric thermal radiation sensors of the array are arranged in spaced apart rows along a base of the array.

5. The ionic thermoelectric thermal radiation sensor of claim 1, further comprising:
   one or more additional ionic thermoelectric sensing units arranged on the substrate and connected to the ionic thermoelectric sensing unit via the first electrical connector, the second electrical connector or an additional electrical connector,
   wherein the one or more additional ionic thermoelectric sensing units are configured to produce voltage via at least one of thermal diffusion of ions or the Soret effect under a temperature difference between surfaces of the one or more additional ionic thermoelectric sensing units, and
   wherein the ionic thermoelectric sensing unit and the one or more additional ionic thermoelectric sensing units comprise a plurality of ionic thermoelectric sensing units of the ionic thermoelectric thermal radiation sensor.

6. The ionic thermoelectric thermal radiation sensor of claim 5,
   wherein the first and second electrical connectors comprise electrically conductive materials comprising at least one of a metal, a semiconductor, a conductive polymer or a conductive ceramic, and
   wherein at least one of the ionic thermoelectric sensing units of the plurality of ionic thermoelectric sensing units comprises a film comprising ionically conductive polymer-based solid or gel electrolytes.

7. The ionic thermoelectric thermal radiation sensor of claim 5, wherein each of the ionic thermoelectric sensing units of the plurality of ionic thermoelectric sensing units comprise N-type and P-type materials, comprising the negative type thermoelectric material and the positive type thermoelectric material, electrically connected in series via the first and second electrical connectors to enhance output signal strength.

8. The ionic thermoelectric thermal radiation sensor of claim 5, wherein the ionic thermoelectric sensing units of the plurality of ionic thermoelectric sensing units have individual widths along the substrate in a range from 0.1 μm to 1000 μm.

9. The ionic thermoelectric thermal radiation sensor of claim 5,
   wherein the ionic thermoelectric sensing units of the plurality of ionic thermoelectric sensing units extend from the substrate in a common direction along a central longitudinal axis of the ionic thermoelectric thermal radiation sensor, and
   wherein at least a first portion of one ionic thermoelectric sensing unit of the plurality of ionic thermoelectric sensing units, along the central longitudinal axis, is spaced along the substrate from at least a second portion of another ionic thermoelectric sensing unit of the plurality of ionic thermoelectric sensing units, along the central longitudinal axis.

10. The ionic thermoelectric thermal radiation sensor of claim 1, wherein the elements of the pair of elements each have a Seebeck coefficient that is greater than 1 mV/K.

11. The ionic thermoelectric thermal radiation sensor of claim 1, wherein the support extends from the second electrical connector to the first electrical connector.

12. An ionic thermoelectric thermal radiation sensor array, comprising:
   a substrate;
   ionic thermoelectric sensing units arranged on the substrate and comprising ionically conductive and electrically insulating material, wherein the ionic thermoelectric sensing units are voltage-producing units each having first and second surfaces spaced apart from and disposed opposite to one another, wherein each of the ionic thermoelectric sensing units comprises a pair of elements spaced apart from one another along the substrate by a support, and wherein each pair of elements comprises a first element comprising a negative type thermoelectric material and a second element comprising a positive type thermoelectric material;

a thermal radiation absorber applied to at least one element of the pair of elements of the ionic thermoelectric sensing unit, wherein the thermal radiation absorber is configured to generate heat when exposed to thermal radiation, including infrared radiation;

first and second electrical connectors that connect the first and second surfaces in series, in parallel or both, wherein pairs of the spaced apart elements comprise respective passivity sensors that generate respective voltages due to respective thermal diffusions of ions or due to the Soret effect under respective temperature differences between the first and second surfaces, wherein the first electrical connector is disposed between respective first surface portions of a first surface of the pair of elements and the thermal radiation absorber, wherein the thermal radiation absorber and the substrate are spaced apart from one another by the pair of elements, and wherein the support extends between the first and second electrical connectors, and wherein the support is comprised of the negative type thermoelectric material or the support is comprised of the positive type thermoelectric material.

13. The ionic thermoelectric thermal radiation sensor array of claim 12, wherein the ionic thermoelectric sensing units comprise polymer-based solid or gel electrolytes.

14. The ionic thermoelectric thermal radiation sensor array of claim 12, further comprising:

one or more additional ionic thermoelectric sensing units arranged on the substrate and connected to the ionic thermoelectric sensing units via the first electrical connector, the second electrical connector or an additional electrical connector, wherein the one or more additional ionic thermoelectric sensing units are configured to produce voltage via at least one of thermal diffusion of ions or the Soret effect under a temperature difference between surfaces of the one or more additional ionic thermoelectric sensing units, and wherein a plurality of ionic thermoelectric sensing units of the ionic thermoelectric thermal radiation sensor array comprises the ionic thermoelectric sensing units and the one or more additional ionic thermoelectric sensing units.

15. The ionic thermoelectric thermal radiation sensor array of claim 14, wherein the first electrical connector and the second electrical connector comprise electrically conductive materials comprising at least one of a metal, a semiconductor, a conductive polymer or a conductive ceramic.

16. The ionic thermoelectric thermal radiation sensor array of claim 14, wherein at least one of the ionic thermoelectric sensing units of the plurality of ionic thermoelectric sensing units comprises a film comprising ionically conductive polymer-based solid or gel electrolytes.

17. A method for fabricating an ionic thermoelectric thermal radiation sensor, the method comprising:

applying an ionic thermoelectric sensing layer on a substrate, the layer comprising ionically conductive and electrically insulating material and being a voltage-producing layer having first and second surfaces spaced apart from and disposed opposite to one another, wherein the ionic thermoelectric sensing unit is configured to produce voltage via thermal diffusion of ions or via the Soret effect under a temperature difference between the first and second surfaces, wherein the ionic thermoelectric sensing layer comprises a pair of elements spaced apart from one another along the substrate, and wherein the pair of elements comprises a first element comprising a negative type thermoelectric material and a second element comprising a positive type thermoelectric material;

applying, to at least one element of the pair of elements of the ionic thermoelectric sensing unit, another layer comprising a thermal radiation absorber that is configured to generate heat when exposed to thermal radiation, including infrared radiation;

connecting respective first surface portions of a first surface of the pair of elements by a first electrical connector and connecting respective second surface portions of a second surface of the pair of elements by a second electrical connector, wherein the first electrical connector is disposed between the respective first surface portions and the thermal radiation absorber, and wherein the thermal radiation absorber and the substrate are spaced apart from one another by the pair of elements; and applying, a support in a position to support the first electrical connector opposite the substrate, wherein the support extends between the pair of elements and between the first electrical connector and the substrate, and wherein the support is comprised of the negative type thermoelectric material or the support is comprised of the positive type thermoelectric material.

18. The method of claim 17, further comprising:

applying at least one of the ionic thermoelectric sensing layer or the another layer by spray coating, spin coating, electrospinning, or three-dimensional printing.

19. The method of claim 17, further comprising:

applying an insulating layer to the substrate prior to applying the ionic thermoelectric sensing layer and the another layer;

applying the another layer opposite the insulating layer relative to the ionic thermoelectric sensing layer.

20. The method of claim 17, wherein the pair of elements define a pair of spaced apart pillars of at least the ionic thermoelectric sensing layer, and wherein the method further comprises forming the pair of spaced apart pillars by cutting the ionic thermoelectric sensing layer using laser cutting.

* * * * *